US011909899B2

(12) United States Patent
Lim

(10) Patent No.: US 11,909,899 B2
(45) Date of Patent: Feb. 20, 2024

(54) HINGED ELECTRONIC DEVICE WITH DISPLACEMENT ALTERING HINGE AND CORRESPONDING SYSTEMS

(71) Applicant: Motorola Mobility LLC, Chicago, IL (US)

(72) Inventor: Yongho Lim, Kildeer, IL (US)

(73) Assignee: Motorola Mobility LLC, Chicago, IL (US)

( * ) Notice: Subject to any disclaimer, the term of this patent is extended or adjusted under 35 U.S.C. 154(b) by 502 days.

(21) Appl. No.: 17/166,946

(22) Filed: Feb. 3, 2021

(65) Prior Publication Data
US 2022/0247846 A1 Aug. 4, 2022

(51) Int. Cl.
*H04M 1/57* (2006.01)
*H04M 1/02* (2006.01)
*H05K 5/02* (2006.01)
*E05D 11/00* (2006.01)
*E05D 3/12* (2006.01)

(52) U.S. Cl.
CPC ....... *H04M 1/0268* (2013.01); *H04M 1/0216* (2013.01); *H05K 5/0226* (2013.01); *E05D 3/122* (2013.01); *E05D 2011/0072* (2013.01); *E05Y 2201/11* (2013.01); *E05Y 2900/606* (2013.01)

(58) Field of Classification Search
CPC .......... H04M 1/0268; H04M 1/0216; H05K 5/0226; E05D 3/122; E05D 2011/0072; E05Y 2201/11; E05Y 2900/606
See application file for complete search history.

(56) References Cited

U.S. PATENT DOCUMENTS 10,601,967 B1   3/2020  Harmon et al.
2021/0044682 A1* 2/2021  Liu ..................... H04M 1/0268

OTHER PUBLICATIONS

Lim, et al., "Application as Filed", U.S. Appl. No. 17/018,932, filed Sep. 11, 2020.
Lim, Yongho , "Application as Filed", U.S. Appl. No. 16/953,251, filed Nov. 19, 2020.
Moussa, Ait , "Introductions to Mechanisms and Kinematics", University of Central Oklahoma Dept of Engineering & Physics; Chapter 1 Lecture; http://www.engineering.uco.edu/~aaitmoussa/ Courses/ENGR3153/Lectures/Chapter1/chapter_1b.pdf; Unknown Publication Date but prior to filing of present application.

* cited by examiner

*Primary Examiner* — Moustapha Diaby
(74) *Attorney, Agent, or Firm* — Philip H. Burrus, IV

(57) ABSTRACT

An electronic device includes a first device housing and a second device housing. The electronic device includes a hinge housing coupling the first device housing to the second device housing. The hinge housing provides a hinge allowing the first device housing to pivot about the hinge housing between an axially displaced open position and a closed position. A hinge housing plate situated within the hinge housing translates within the hinge housing between a first position and a second position when the first device housing and the second device housing pivot about the hinge housing from the axially displaced open position to the closed position, thereby allowing at least a portion of a service loop defined by a flexible display to situate within the hinge housing when the first device housing and second device housing are in the closed position.

20 Claims, 14 Drawing Sheets

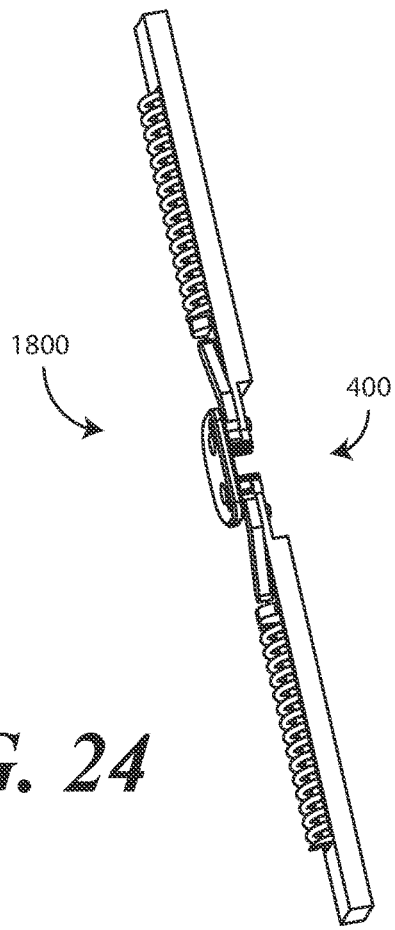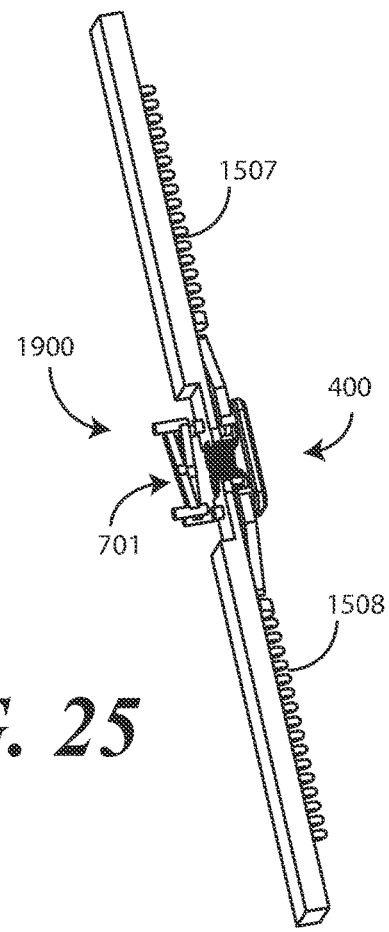

US 11,909,899 B2

HINGED ELECTRONIC DEVICE WITH DISPLACEMENT ALTERING HINGE AND CORRESPONDING SYSTEMS

BACKGROUND

Technical Field

This disclosure relates generally to electronic devices, and more particularly to hinged electronic devices.

Background Art

Portable electronic communication devices, especially smartphones, have become ubiquitous. People all over the world use such devices to stay connected. These devices have been designed in various mechanical configurations. A first configuration, known as a "candy bar," is generally rectangular in shape, has a rigid form factor, and has a display disposed along a major face of the electronic device. By contrast, a "clamshell" device has a mechanical hinge that allows one housing to pivot relative to the other.

Some consumers prefer candy bar devices, while others prefer clamshell devices. To satisfy the latter, it would thus be desirable to have an improved hinged electronic device.

BRIEF DESCRIPTION OF THE DRAWINGS

FIG. 24 illustrates a perspective view of one explanatory hinge actuator mechanism in the axially displaced open position.

FIG. 25 illustrates another perspective view of one explanatory hinge actuator mechanism in the axially displaced open position.

Figure 1:
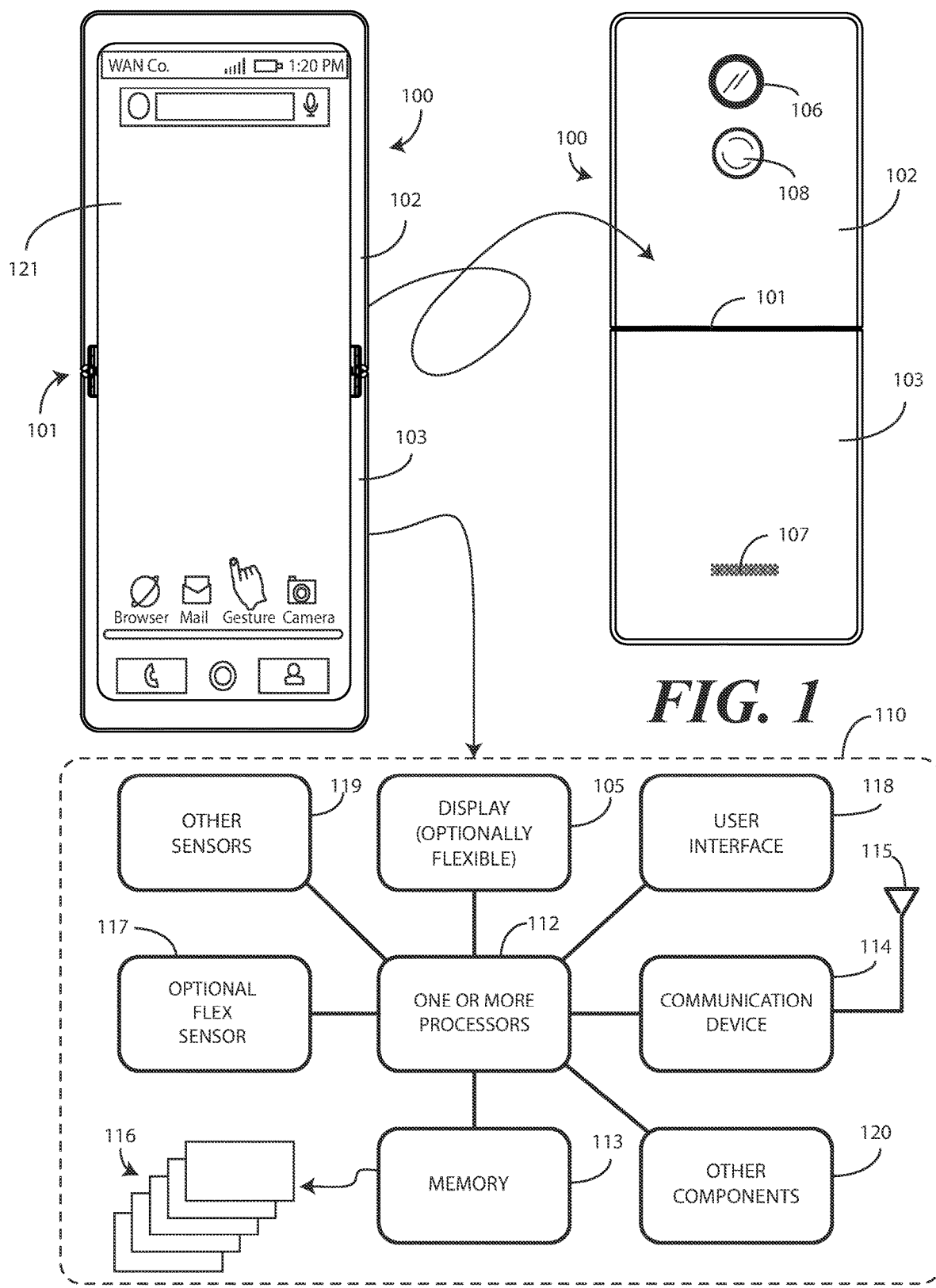
FIG. 1 illustrates one explanatory electronic device in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Relational terms such as first and second, top and bottom, and the like may be used solely to distinguish one entity or action from another entity or action without necessarily requiring or implying any actual such relationship or order between such entities or actions. As used herein, components may be "operatively coupled" when information can be sent between such components, even though there may be one or more intermediate or intervening components between, or along the connection path.

The terms "substantially", "essentially", "approximately", "about" or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide an electronic device that includes at least a first device housing and a second device housing. In one or more embodiments, a hinge housing couples the first device housing to the second device housing. In one or more embodiments, the hinge housing comprises a hinge allowing the first device housing to pivot about the hinge relative to the second device housing between an axially displaced open position and a closed position.

In one or more embodiments, a flexible display is coupled to the first device housing and the second device housing and spans the hinge. The flexible display deforms when the first device housing pivots about the hinge relative to the second device housing. In other embodiments, the first device housing and the second device housing each have coupled thereto a separate display, which may be rigid or flexible. For example, a first display may be coupled to the first device housing on one side of the hinge, while a second display is coupled to the second device housing on a second side of the hinge.

In one or more embodiments, the hinge not only facilitates the bending operation, but also works to improve the reliability and usability of the flexible display. In one or more embodiments, the hinge does this via the use of one or more support plates that are coupled to a hinge housing and are pivotable relative to the hinge housing when the first device housing pivots about the hinge relative to the second device housing.

In one or more embodiments, a first support plate is pivotally coupled to a first side of the hinge housing. The first support plate then extends distally into the first device housing from the first side of the hinge housing. Similarly, a second support plate is pivotally coupled to a second side of the hinge housing. The second support plate extends distally into the second device housing from the second side of the hinge housing.

In addition to the first support plate and the second support plate, in one or more embodiments the hinge housing includes a hinge housing plate that translates within the hinge housing to allow a portion of a service loop formed by the flexible display when the first device housing and the second device housing pivot to the closed position to situate within the hinge housing. In one or more embodiments, the hinge housing plate is situated within the hinge housing. The hinge housing plate translates within the hinge housing between a first position and a second position when the first device housing and the second device housing pivot about the hinge housing from the axially displaced open position to the closed position. In one or more embodiments, the second position is situated deeper within the hinge housing than the first position.

The hinge housing, the hinge housing plate, and the support plates coupled to the hinge housing serve two functions. First, they provide mechanical support for the flexible display when the first device housing has pivoted about the hinge relative to the second device housing to an axially displaced open position. However, when the first device housing pivots about the hinge relative to the second device housing to a closed position, in which interior surfaces of the first device housing and the second device housing abut, the support plates translate along inclined planes within the first device housing and second device housing, respectively, to recede into the first device housing and second device housing. Said differently, when the first device housing pivots about the hinge relative to the second device housing to the closed position, the support plates move toward the exterior surfaces of the first device housing and the second device housing, thereby receding "outward" from the interior surfaces of the first device housing and the second device housing. At the same time, the hinge housing plate translates into the hinge housing, thereby freeing additional space within the hinge housing. This "collapse" of the first support plate and the second support plate, combined with the receding of the hinge housing plate into the hinge housing creates a cavity in the electronic device that allows the flexible display to form a service loop when the electronic device is in the closed position. The service loop prevents the flexible display from being damaged or developing memory in the folded position when the electronic device is in the closed position.

Embodiments of the disclosure contemplate that bending operations occurring in a housing of an electronic device with a flexible display can present technical challenges. Illustrating by example, it can be difficult to provide uniform mechanical support beneath the flexible display when the electronic device is in the open position. It can further be difficult to limit deformation due to bending operations such that the deformation occurs within a predefined radius.

Advantageously, embodiments of the disclosure provide solutions to each one of these challenges. Specifically hinges configured in accordance with one or more embodiments of the disclosure provide a solution that provides the needed system flexibility by providing support for the flexible display when in the open position, but allows for a large radius service loop of the flexible display to occur when the electronic device is in the closed position.

In one or more embodiments, each of the first device housing and the second device housing defines a support plate receiving recess at the hinged portion of the electronic device. In one or more embodiments, these support plate receiving recesses each comprise an inclined plane, which is physically separated from the hinge housing of the hinge by a predefined distance. A distal end of each support plate contacts the inclined plane to translate along the inclined plane when the first device housing pivots about the hinge relative to the second device housing. Thus, if a first side of a first support plate is coupled to the hinge housing, a second, distal side of the first support plate contacts the inclined plane in the support plate receiving recess of the first device housing. The second, distal side of the first support plate then translates along the inclined plane when the first device housing pivots about the hinge relative to the second device housing. A second support plate and support plate receiving recess can be similarly configured in the second device housing.

The distal ends of each of the first support plate and the second support plate therefore travel, in one or more embodiments, along their respective inclined planes between a first position within the first device housing and the second device housing, respectively, to a second position within the first device housing and the second device housing, respectively, when the first device housing and the second device housing pivot about the hinge from an axially displaced open position to a closed position. In one or more embodiments, the support plates are closer to the flexible display when in the first position and are farther from the flexible display when in the second position. In one or more embodiments, the support plates are farther from exterior surfaces of the first device housing and the second device housing when in the first position but are closer to those outer surfaces of the first device housing and the second device housing when in the second position. This results in the second position being deeper within the first device housing and the second device housing, respectively, than the first position.

In one or more embodiments, the hinge housing defines a hinge housing plate receiving recess in which the hinge housing plate can translate as well. In one or more embodiments, the hinge housing plate travels within the hinge housing between a first position within the hinge housing to a second position within the hinge housing when the first device housing and the second device housing pivot about the hinge from an axially displaced open position to a closed position. In one or more embodiments, the hinge housing plate moves into the hinge housing when the first device housing and second device housing pivot about the hinge housing to the closed position, and then moves outward from an inner surface of the hinge housing when the first device housing and second device housing pivot about the hinge housing to the axially displaced open position. This allows the hinge housing and the hinge housing plate to define a bridge mechanically supporting the flexible display when the first device housing and the second device housing are in the axially displaced open position. However, when the first device housing and the second device housing are pivoted to the closed position, the translation of the hinge housing plate into the hinge housing allows at least a portion of the service loop formed by the flexible display to situate within the hinge housing.

In one or more embodiments, the flexible display is positioned within a linear recess of the first device housing and the second device housing so that it—or a fascia disposed atop the flexible display—can be flush with the interior surfaces of the first device housing and second device housing, respectively. In other embodiments, the linear recess will be omitted, and the flexible display will simply sit atop planar interior surfaces of the first device housing and the second device housing. In either embodiment, when the first device housing pivots about the hinge relative to the second device housing to the axially displaced, open position, the first support plate, the hinge housing, the hinge housing plate, and the second support plate bridge the linear recess (or planar interior surfaces) to provide mechanical support for the flexible display. By contrast, by receding into the housings, the first support plate, the hinge housing, the hinge housing plate, and the second support plate define boundaries within which the flexible display defines a service loop when the first device housing and the second device housing pivot about the hinge from the axially displaced open position to a closed position.

Embodiments of the disclosure thus provide a novel hinge mechanism that properly supports a flexible display when a hinged electronic device is in the open position. Embodiments of the disclosure contemplate that the mechanical stack of the flexible display is frequently too soft or flexible to support itself. Accordingly, when the electronic device is in the axially displaced open position the support plates, hinge housing, and hinge housing plate provide rigid support across the hinge portion of the electronic device. At the same time, the support plates recede into the housing and the hinge housing plate recedes into the hinge housing when the electronic device is folded to allow the flexible display to form a service loop. In one or more embodiments, the service loop at least partially situates within the hinge housing. Advantageously, the hinge housing, hinge housing plate, and corresponding support plates define kinematic linkages that move when the first device housing pivots about the hinge relative to the second device housing to the closed position. As noted above, the support plates and hinge housing plate recede backwards to provide space for the flexible display to bend into a teardrop shaped service loop.

Embodiments of the disclosure contemplate that when the flexible display is fixedly coupled to the first device housing and also fixedly coupled to the second device housing, with the first device housing, hinge housing, and second device housing configured to cause the flexible display to extend and become substantially planar when the first device housing and second device housing are in the axially displaced open position, the path length of the mechanical mechanism defined by the first support plate, the second support plate, and the hinge housing can be different than the path length of the flexible display when each is in the closed position. Said differently, for an electronic device configured to extend a flexible display flat when in the axially displaced open position, when the electronic device is in the closed position, the length of the service loop defined by the flexible display and the mechanical boundaries defined by the first support plate, hinge housing, hinge housing plate, and second support plate may be different. In particular, to provide sufficient room for the service loop, the mechanical mechanism defined by the first support plate, the hinge housing, hinge housing plate, and the second support plate may be longer than the length of display that bends to define the service loop. This difference in length can be problematic in that it can result in either deformations in the service loop when the electronic device is in the closed position, or alternatively mechanical strain or unevenness in the flexible display when the electronic device is in the axially displaced open position.

While a spring-loaded plate can be used to apply tension to one end of the flexible display to compensate for the distance differential, experimental testing has shown that this can cause the flexible display to "feel" like its moving when a user is delivering user input to the flexible display. Advantageously, embodiments of the disclosure provide an improved hinge mechanism that eliminates the need for any spring-loaded plate. Hinges configured in accordance with embodiments of the disclosure allow for the flexible display to be fixedly connected to the first device housing and second device housing, respectively, and to fully extend when the electronic device is in the axially displaced open position, yet form a proper service loop when the electronic device is in the closed position.

Embodiments of the disclosure accomplish this by employing a hinge mechanism that changes an amount of area within the hinge housing via translation of the hinge housing plate. Said differently, as a result of the hinge housing plate receding into the hinge housing, the path length available for the flexible display changes between the axially displaced open position and closed position. Effectively, hinges configured in accordance with embodiments of the disclosure cause the hinge housing plate to closer to the distal ends of the sidewalls of the hinge housing when the electronic device is in the axially displaced open position, and farther from the distal ends of the sidewalls of the hinge housing when the electronic device is in the closed position. This translating hinge housing plate compensates for the difference between the bending length of the flexible display and the length of the mechanical mechanism supporting the flexible display.

This change in path length advantageously compensates for the distance in the bending length of the flexible display. This also eliminates the need for any spring-loaded plate or other tensioning mechanism to be included. Moreover, it allows ends of the flexible display to be fixedly coupled to the first device housing and second device housing, respectively, thereby providing a more rigid and stable feel for users interacting with the flexible display using touch input. Other advantages of embodiments of the disclosure will be explained below. Still others will be obvious to those of ordinary skill in the art having the benefit of this disclosure.

Turning now to FIG. 1, illustrated therein is one explanatory electronic device 100 configured in accordance with one or more embodiments of the disclosure. The electronic device 100 of FIG. 1 is a portable electronic device. For illustrative purposes, the electronic device 100 is shown as a smartphone. However, the electronic device 100 could be any number of other devices as well, including tablet computers, gaming devices, multimedia players, and so forth. Still other types of electronic devices can be configured in accordance with one or more embodiments of the disclosure as will be readily appreciated by those of ordinary skill in the art having the benefit of this disclosure.

The electronic device 100 includes a first device housing 102 and a second device housing 103. In one or more embodiments, a hinge 101 couples the first device housing 102 to the second device housing 103. In one or more embodiments, the first device housing 102 is selectively pivotable about the hinge 101 relative to the second device housing 103. For example, in one or more embodiments the first device housing 102 is selectively pivotable about the hinge 101 between a closed position, shown and described below with reference to FIG. 2, and an axially displaced open position, shown and described below with reference to FIGS. 4-5.

In one or more embodiments the first device housing 102 and the second device housing 103 are manufactured from a rigid material such as a rigid thermoplastic, metal, or composite material, although other materials can be used. Still other constructs will be obvious to those of ordinary skill in the art having the benefit of this disclosure. In the illustrative embodiment of FIG. 1, the electronic device 100 includes a single hinge. However, in other embodiments two or more hinges can be incorporated into the electronic device 100 to allow it to be folded in multiple locations.

This illustrative electronic device 100 of FIG. 1 includes a display 105. The display 105 can optionally be touch-sensitive. In one embodiment where the display 105 is touch-sensitive, the display 105 can serve as a primary user interface 118 of the electronic device 100. Users can deliver user input to the display 105 of such an embodiment by delivering touch input from a finger, stylus, or other objects disposed proximately with the display 105.

In one embodiment, the display 105 is configured as an organic light emitting diode (OLED) display fabricated on a flexible plastic substrate, thereby making the display 105 a flexible display 121. This allows the display 105 to be flexible so as to deform when the first device housing 102 pivots about the hinge 101 relative to the second device housing 103. However, it should be noted that other types of displays suitable for use with the electronic device 100 will be obvious to those of ordinary skill in the art having the benefit of this disclosure. Illustrating by example, as will be described in more detail with reference to FIG. 26 below, in other embodiments multiple displays can be used. For instance, a first rigid display can be coupled to the first device housing 102, while a second, separate rigid display can be coupled to the second device housing 103, with the hinge 101 separating the two displays.

Where a flexible display 121 is used, in one or more embodiments an OLED is constructed on flexible plastic substrates can allow the flexible display 121 to bend with various bending radii. For example, some embodiments allow bending radii of between thirty and six hundred millimeters. Other substrates allow bending radii of around five millimeters to provide a display that is foldable through active bending.

In one or more embodiments the flexible display 121 may be formed from multiple layers of flexible material such as flexible sheets of polymer or other materials. In this illustrative embodiment, the flexible display 121 is fixedly coupled to the first device housing 102 and the second device housing 103. The flexible display 121 spans the hinge 101 in this illustrative embodiment.

Features can be incorporated into the first device housing 102 and/or the second device housing 103. Examples of such features include a camera 106 or an optional speaker port 107, which are shown disposed on the rear side of the electronic device 100 in this embodiment but could be placed on the front side as well. In this illustrative embodiment, a user interface component 108, which may be a button or touch sensitive surface, can also be disposed along the rear side of the first device housing 102. As noted, any of these features are shown being disposed on the rear side of the electronic device 100 in this embodiment, but could be located elsewhere, such as on the front side in other embodiments. In other embodiments, these features may be omitted.

A block diagram schematic 110 of the electronic device 100 is also shown in FIG. 1. The block diagram schematic 110 can be configured as a printed circuit board assembly disposed within either or both of the first device housing 102 or the second device housing 103 of the electronic device 100. Various components can be electrically coupled together by conductors or a bus disposed along one or more printed circuit boards. For example, some components of the block diagram schematic 110 can be configured as a first electronic circuit fixedly situated within the first device housing 102, while other components of the block diagram schematic 110 can be configured as a second electronic circuit fixedly situated within the second device housing 103. As will be described in more detail below, a flexible substrate can then span the hinge 101 to electrically couple the first electronic circuit to the second electronic circuit.

In one or more embodiments, the electronic device 100 includes one or more processors 112. In one embodiment, the one or more processors 112 can include an application processor and, optionally, one or more auxiliary processors. One or both of the application processor or the auxiliary processor(s) can include one or more processors. One or both of the application processor or the auxiliary processor (s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. A storage device, such as memory 113, can optionally store the executable software code used by the one or more processors 112 during operation.

In this illustrative embodiment, the electronic device 100 also includes a communication circuit 114 that can be configured for wired or wireless communication with one or more other devices or networks. The networks can include a wide area network, a local area network, and/or personal area network. The communication circuit 114 may also utilize wireless technology for communication, such as, but are not limited to, peer-to-peer or ad hoc communications such as HomeRF, Bluetooth and IEEE 802.11, and other forms of wireless communication such as infrared technology. The communication circuit 114 can include wireless communication circuitry, one of a receiver, a transmitter, or transceiver, and one or more antennas 115.

In one embodiment, the one or more processors 112 can be responsible for performing the primary functions of the electronic device 100. For example, in one embodiment the one or more processors 112 comprise one or more circuits operable with one or more user interface devices, which can include the display 105, to present, images, video, or other presentation information to a user. The executable software code used by the one or more processors 112 can be configured as one or more modules 116 that are operable with the one or more processors 112. Such modules 116 can store instructions, control algorithms, logic steps, and so forth.

In one embodiment, the one or more processors 112 are responsible for running the operating system environment of the electronic device 100. The operating system environment can include a kernel and one or more drivers, and an application service layer, and an application layer. The operating system environment can be configured as executable code operating on one or more processors or control circuits of the electronic device 100. The application layer can be responsible for executing application service modules. The application service modules may support one or more applications or "apps." The applications of the application layer can be configured as clients of the application service layer to communicate with services through application program interfaces (APIs), messages, events, or other inter-process communication interfaces. Where auxiliary processors are used, they can be used to execute input/output functions, actuate user feedback devices, and so forth.

Figure 2:
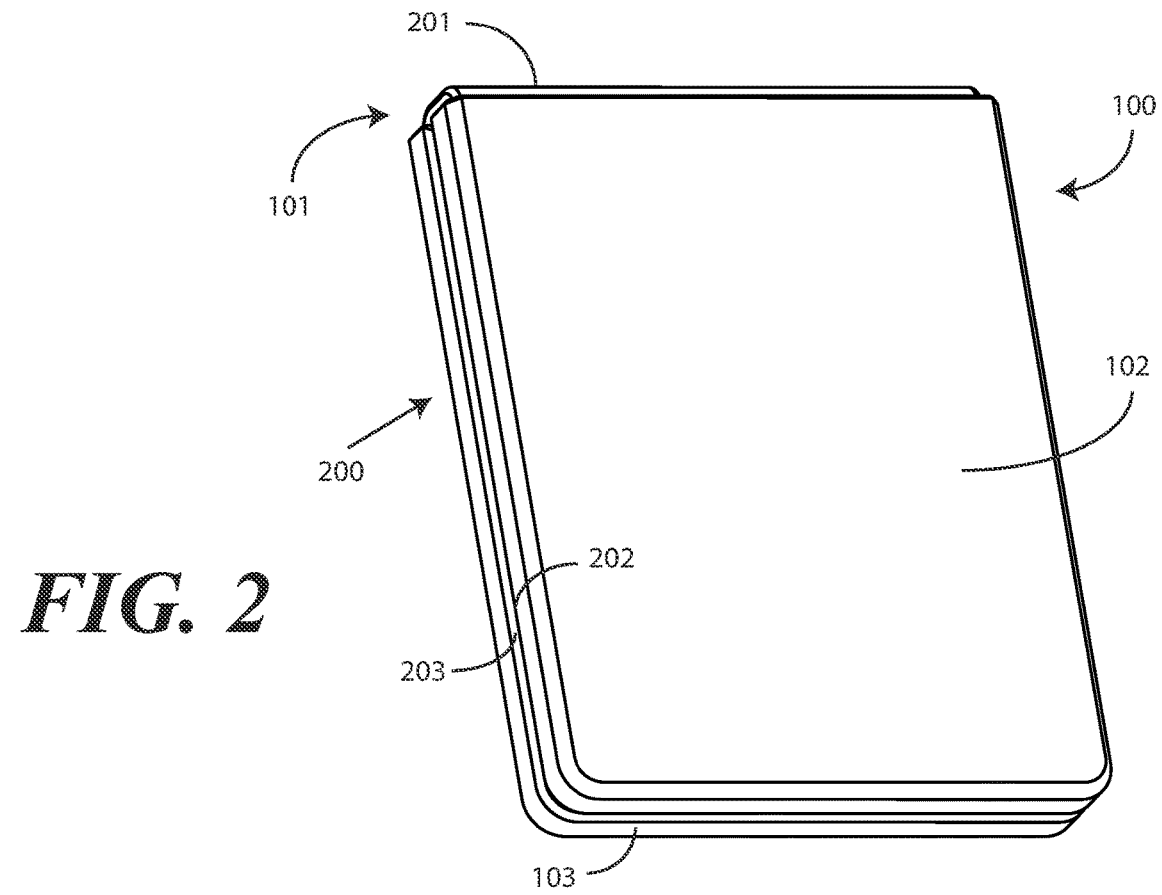
FIG. 2 illustrates a perspective view of one explanatory electronic device in accordance with one or more embodiments of the disclosure in a closed position.
Figure 3:
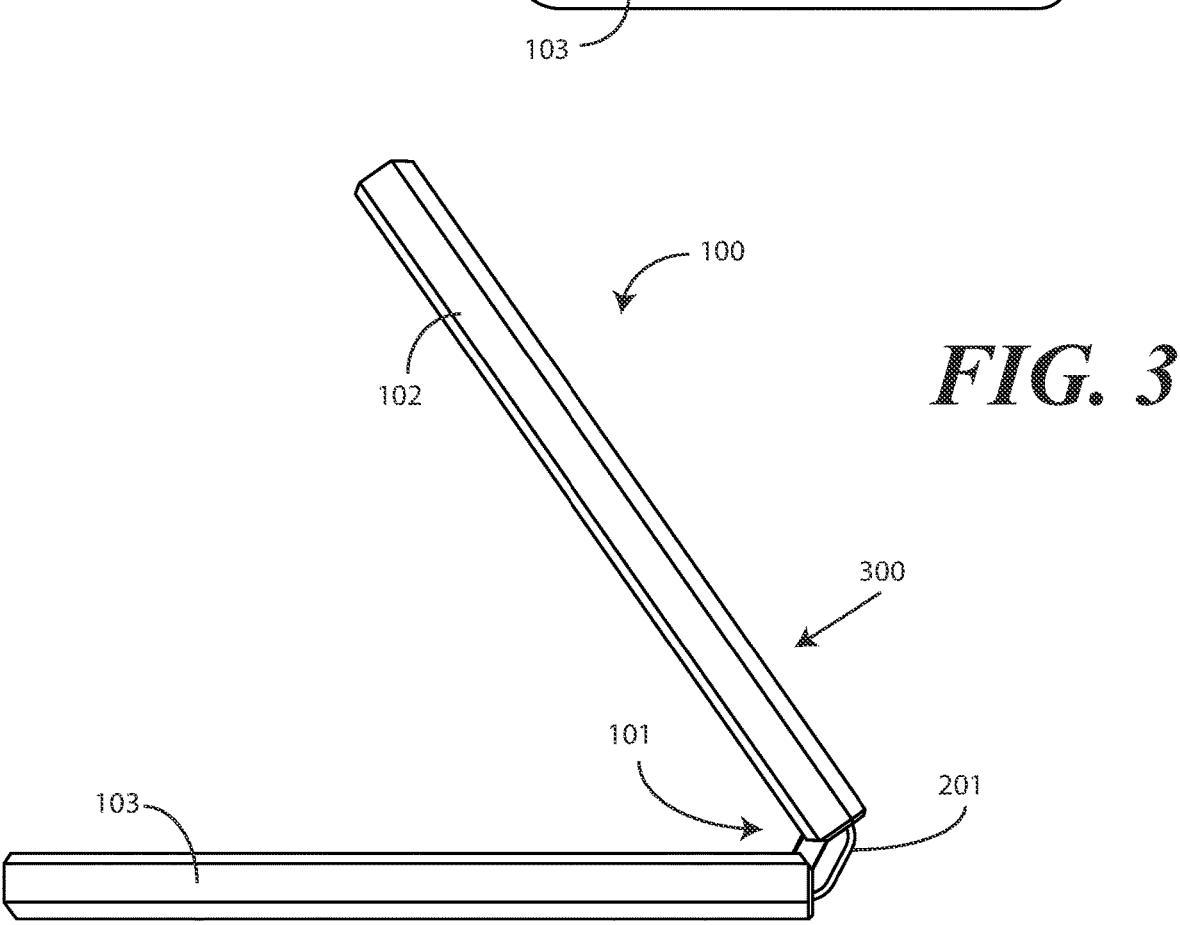
FIG. 3 illustrates a side elevation view of one explanatory electronic device in accordance with one or more embodiments of the disclosure in a partially open position.

In one embodiment, the electronic device 100 optionally includes one or more flex sensors 117, operable with the one or more processors 112, to detect a bending operation that causes the first device housing 102 to pivot about the hinge 101 relative to the second device housing 103, thereby transforming the electronic device 100 into a deformed geometry, such as that shown in FIGS. 2-3. The inclusion of flex sensors 117 is optional, and in some embodiment flex sensors 117 will not be included.

In one embodiment, the one or more processors 112 may generate commands or execute control operations based on information received from the various sensors, including the one or more flex sensors 117, the user interface 118, or the other sensors 119. The one or more processors 112 may also generate commands or execute control operations based upon information received from a combination of the one or more flex sensors 117, the user interface 118, or the other sensors 119. Alternatively, the one or more processors 112 can generate commands or execute control operations based upon information received from the one or more flex sensors 117 or the user interface 118 alone. Moreover, the one or more processors 112 may process the received information alone or in combination with other data, such as the information stored in the memory 113.

The one or more other sensors 119 may include a microphone, an earpiece speaker, a second loudspeaker (disposed beneath speaker port 107), and a user interface component such as a button or touch-sensitive surface. The one or more other sensors 119 may also include key selection sensors, proximity sensors, a touch pad sensor, a touch screen sensor, a capacitive touch sensor, and one or more switches. Touch sensors may used to indicate whether any of the user actuation targets present on the display 105 are being actuated. Alternatively, touch sensors disposed in the electronic device 100 can be used to determine whether the electronic device 100 is being touched at side edges or major faces of the first device housing 102 or the second device housing 103. The touch sensors can include surface and/or housing capacitive sensors in one embodiment. The other sensors 119 can also include audio sensors and video sensors (such as a camera).

The other sensors 119 can also include motion detectors, such as one or more accelerometers or gyroscopes. For example, an accelerometer may be embedded in the electronic circuitry of the electronic device 100 to show vertical orientation, constant tilt and/or whether the electronic device 100 is stationary. The measurement of tilt relative to gravity is referred to as "static acceleration," while the measurement of motion and/or vibration is referred to as "dynamic acceleration." A gyroscope can be used in a similar fashion.

Other components 120 operable with the one or more processors 112 can include output components such as video outputs, audio outputs, and/or mechanical outputs. Examples of output components include audio outputs such as speaker port 107, earpiece speaker, or other alarms and/or buzzers and/or a mechanical output component such as vibrating or motion-based mechanisms. Still other components will be obvious to those of ordinary skill in the art having the benefit of this disclosure.

It is to be understood that FIG. 1 is provided for illustrative purposes only and for illustrating components of one electronic device 100 in accordance with embodiments of the disclosure and is not intended to be a complete schematic diagram of the various components required for an electronic device. Therefore, other electronic devices in accordance with embodiments of the disclosure may include various other components not shown in FIG. 1 or may include a combination of two or more components or a division of a particular component into two or more separate components, and still be within the scope of the present disclosure. Illustrating by example, the electronic device 100 of FIG. 1 includes a single flexible display 121. By contrast, another embodiment shown below in FIG. 26 includes two separate and distinct displays, and so forth. Additionally, as will be described in more detail below, some embodiments include support plates that are pivotally coupled to a hinge housing of the hinge 101. In other embodiments, these support plates will be omitted.

Turning now to FIG. 2, illustrated therein is the electronic device 100 in a closed state. In this state, the first device housing 102 has been pivoted about the hinge 101 toward the second device housing 103 to a closed position 200. When in the closed position 200, a front surface 202 of the first device housing 102 abuts a front surface 203 of the second device housing 103. Additionally, in this illustrative embodiment, a hinge housing 201 comprising the hinge 101 is visible when the electronic device 100 is in the closed position 200. In other embodiments, the hinge housing 201 will remain concealed when the first device housing 102 pivots about the hinge 101 relative to the second device housing 103 to the closed position 200. Effectively, in either embodiment, the first device housing 102 and the second device housing 103 are analogous to clam shells that have been shut by the claim, thereby giving rise to the "clamshell" style of device. When the clam shells open, the flexible display (121) is revealed.

In some embodiments, features can be included to further retain the electronic device 100 in the closed position 200. Illustrating by example, in another embodiment, a mechanical latch can be included to retain the first device housing 102 and the second device housing 103 in the closed position 200.

In still another embodiment, magnets can be incorporated into the front surface 202 of the first device housing 102 and the front surface 203 of the second device housing 103. For instance, magnets can be placed in the first device housing 102 and the second device housing 103 to retain the first device housing 102 and the second device housing 103 in the closed position 200.

In still other embodiments, frictional elements can be incorporated into the hinge 101 to retain the first device housing 102 and the second device housing 103 in a particular position. A stator motor could be integrated into the hinge 101 as well. Still other mechanical structures and devices suitable for retaining the electronic device 100 in the closed position 200 will be obvious to those of ordinary skill in the art having the benefit of this disclosure. As will be described below with reference to FIGS. 15-28, in other embodiments retention devices can be omitted due to the fact that torsion springs used.

Turning now to FIG. 3, the electronic device 100 is shown being transitioned from the closed position (200) of FIG. 2 to a partially open position 300. Specifically, the first device housing 102 is pivoting about the hinge 101 away from the second device housing 103 toward an open position. The open position 300 shown in FIG. 3 is a "tent position." In the side elevation view of FIG. 3, the hinge housing 201 is exposed between the first device housing 102 and the second device housing 103.

Figures 4, 5:
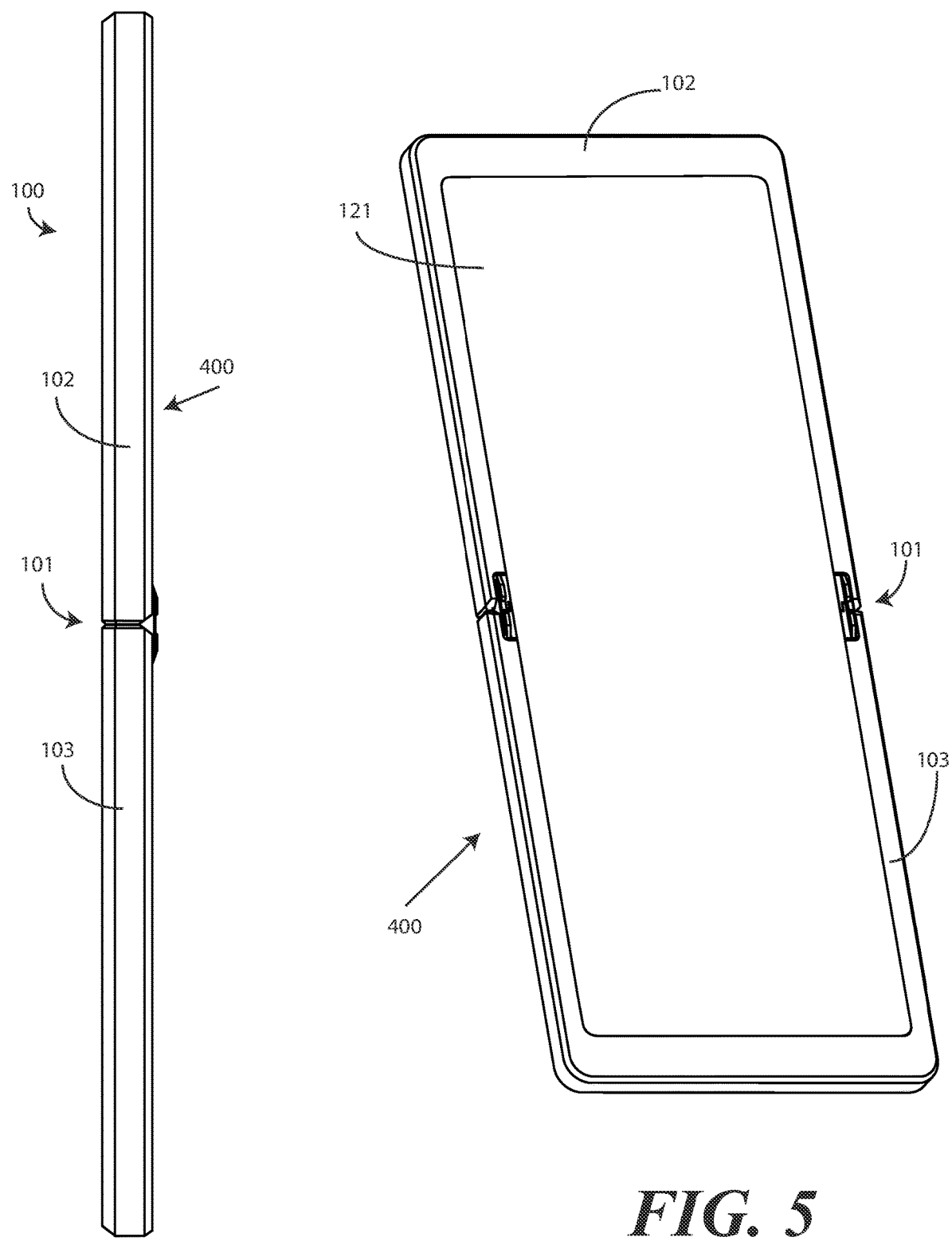
FIG. 4 illustrates a side elevation view of one explanatory electronic device in accordance with one or more embodiments of the disclosure in an axially displaced open position.
FIG. 5 illustrates a perspective view of one explanatory electronic device in accordance with one or more embodiments of the disclosure in the axially displaced open position.

Turning now to FIGS. 4 and 5, illustrated therein is the electronic device 100 in an axially displaced open position 400. In the axially displaced open position 400, the first device housing 102 is rotated about the hinge 101 so as to be axially displaced 180-degrees out of phase with the second device housing 103, thereby revealing the flexible display 121 of this embodiment. In this illustrative embodiment, this causes the hinge housing (201) to be concealed within the first device housing 102 and second device housing 103.

In such a configuration, the first device housing 102 and the second device housing 103 effectively define a plane. Since this illustrative embodiment includes a flexible display 121, the flexible display 121 has been elongated into a flat position.

Figure 6:
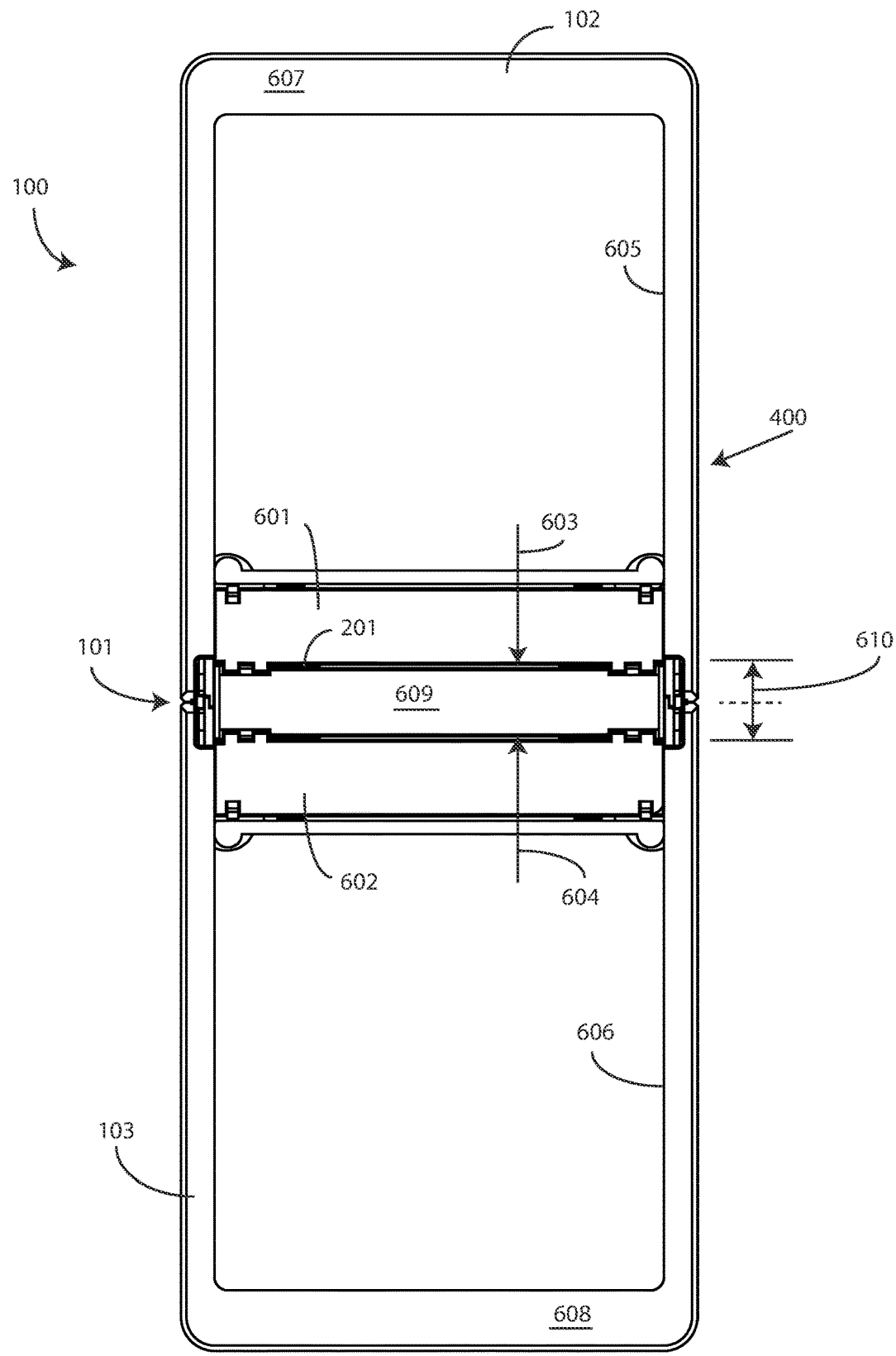
FIG. 6 illustrates an elevation view of one explanatory electronic device in accordance with embodiments of the disclosure with the flexible display removed so that the hinge is visible.

Turning now to FIG. 6, the electronic device 100 is shown with the flexible display (121), as well as any overlaying fascia, removed so that additional details of the hinge 101 can more readily be seen. As shown in FIG. 6, in one or more embodiments the hinge 101 includes a hinge housing 201, to which the first device housing 102 to the second device housing 103 are coupled. The hinge 101 of the hinge housing 201 can further include one or more pivots allowing the first device housing 102 to pivot about the hinge 101, which is operatively coupled to the hinge housing 201, relative to the second device housing 103.

Optionally, as will be described in more detail below, one or more support plates can be included to translate within the first device housing 102 and the second device housing 103, respectively. The use of such support plates is advantageous when the flexible display 121 used in the electronic device 100. However, where rigid displays are used, such as in the embodiment of FIG. 26, the support plates can be omitted.

In this illustrative embodiment, a first support plate 601 is pivotally coupled to a first pivot and extends from a first side 603 of the hinge housing 201. The first support plate 601 extends distally into the first device housing 102 from the first side 603 of the hinge housing 201. A second support plate 602 is then pivotally coupled to a second pivot and extends from a second side 604 of the hinge housing 201. The second support plate 602 then extends distally into the second device housing 103 from the second side 604 of the hinge housing 201.

In one or more embodiments, a hinge housing plate 609 is situated within the hinge housing 201. In one or more embodiments the hinge housing plate 609 translates within the hinge housing 201 between a first position, shown in FIG. 12, and a second position, shown in FIG. 11, when the first device housing 102 pivots about the hinge 101 relative to the second device housing 103 between the axially displaced open position of FIG. 6 and the closed position of FIG. 2. In one or more embodiments, the second position is situated deeper within the hinge housing 201 than the first position.

In one or more embodiments, the first device housing 102 and the second device housing 103 each define linear recesses 605,606 into which a display (105)—be it a flexible display (121) or rigid display—may be positioned. In one or more embodiments where a flexible display (121) is used, the flexible display (121) is positioned within the linear recess 605 of the first device housing 102 and the linear recess 606 of the second device housing 103 so that it—or a fascia disposed atop the flexible display (121)—sits flush with the interior surface 607 of the first device housing 102 and the interior surface 608 of the second device housing 103. Where a flexible display (121) is used, the flexible display (121) will span the hinge 101 by passing across the hinge housing 201 and hinge housing plate 609 in such an embodiment.

By contrast, where two displays are used (as shown below in FIG. 26), a first display can be positioned within the linear recess 605 of the first device housing 102. A second display can then be positioned in the linear recess 606 of the second device housing 103. This allows each display—or a fascia disposed atop each display—to sit flush with the interior surface 607 of the first device housing 102 and the interior surface 608 of the second device housing 103. Where two displays are used, the hinge 101 and hinge housing 201 will separate one display from the other. The hinge housing 201 of such an embodiment can be made narrower than that shown in FIG. 6 due to the fact that it need not provide mechanical support for a display as is the case when the display is a flexible display (121).

In still other embodiments, the linear recess 605,606 will be omitted. The display(s), whether flexible or not, as well as any accompanying fascia, may then simply sit atop planar surfaces defined by the interior surface 607 of the first device housing 102 and the interior surface 608 of the second device housing 103.

Where the linear recesses 605,606 are included and a flexible display (121) is used, the flexible display (121) can be positioned within these linear recesses 605,606 to span the hinge 101 and hinge housing 201. Regardless of whether the linear recesses 605,606 are included, when the first device housing 102 pivots about the hinge 101 and hinge housing 201 relative to the second device housing 103 to the axially displaced open position 400 shown in FIG. 6, the first support plate 601, the hinge housing 201, the hinge housing plate 609, and the second support plate 602 bridge the linear recesses 605,606 (or planar interior surfaces in the other embodiment) to provide positive mechanical support for the flexible display (121).

Where electrical components, e.g., processors, memories, communication circuits, and other components described in the block diagram schematic (110) of FIG. 1 are positioned in each of the first device housing 102 and the second device housing 103, a flexible substrate can be included to electrically couple these components together across the hinge 101 and through the hinge housing 201 and under the hinge housing plate 609. In one or more embodiments the hinge housing 201 can include a duct through which the flexible substrate can pass. In one or more embodiments, the flexible substrate, which can bend as the first device housing 102 and the second device housing 103 pivot about the hinge 101 to the closed position (200) of FIG. 2, allows electrical signals to pass back and forth between circuit components disposed in the first device housing 102 and the second device housing 103.

In one or more embodiments, one or more spring-loaded trays can be included within one or both of the first device housing 102 or the second device housing 103. Illustrating by example, a spring-loaded and slidable tray can be disposed within the first device housing 102. One example of such a solution is described in commonly assigned U.S. Pat. No. 10,491,725 to Harmon et al., entitled "Hinged Electronic Device with Moving Support Plates for a Flexible Display and Corresponding Systems," which is incorporated herein by reference. Alternatively, the tray could be disposed in the second device housing 103. Additionally, in other embodiments both the first device housing 102 and the second device housing 103 could include trays as well.

In one or more embodiments, a first end of a flexible display (121) can be fixedly coupled to the second device housing 103. The second end of the flexible display (121) can then be coupled to the sliding tray. In one or more embodiments, the tray is slidably coupled to the first device housing 102 and is biased away from the hinge 101 and hinge housing 201 by a spring. It should be noted that while a spring is used to bias the tray away from the hinge 101 and hinge housing 201 in some embodiments, in other embodiments the spring can be replaced by a damper device or other equivalent. Where configured as a damper device, the damper device can include a spring with a nested shock damper, which can be pneumatic or hydraulic, to dampen the action of the spring. Other devices suitable for use instead of the spring will be obvious to those of ordinary skill in the art having the benefit of this disclosure.

Where a tray is included, the spring(s) can operably bias the tray away from the hinge 101 to flatten the flexible display (121) when the first device housing 102 pivots about the hinge 101 away from the second device housing 103 to the open position 400. A first end of the flexible display (121) can be coupled to the second device housing 103, while a second end is coupled to the tray. In one or more embodiments, the spring biases the tray away from the hinge 101, and thus away from the second device housing 103, to remove slack from the flexible display (121) when the first device housing 102 is pivoted about the hinge 101 toward the second device housing 103 to the closed position (200) of FIG. 2.

While inclusion of a spring-loaded tray works well in practice, experimental testing has shown that the inclusion of a tray, with one end of the display (105) coupled thereto, can cause a flexible display (121) to "feel" like its moving when a user is delivering user input to the flexible display (121). To eliminate this tactile artifact, and to provide for more display stability when a user is interacting with the flexible display (121) with a finger or stylus, in the illustrative embodiment of FIG. 6 the hinge housing plate 609 moves within the hinge housing 201 to alter a path length 610 of the flexible display (121) across the hinge housing 201 when the first device housing 102 and the second device housing 103 pivot about the hinge housing 201 between the axially displaced open position 400 of FIG. 6 and the closed position (200) of FIG. 2. Advantageously, this changing of the path length 610 eliminates the need for any spring-loaded tray, as it allows the flexible display (121) to be fixedly coupled to the first device housing 102 and the second device housing 103, respectively. Moreover, the flexible display (121) is able to fully extend when the electronic device 100 is in the axially displaced open position 400 of FIG. 6, while still forming a proper service loop (shown, for example in FIG. 9 below) when the electronic device 100 is in the closed position (200).

This occurs because the service loop of the flexible display (121) is able to situate within the hinge housing 201 once the hinge housing plate 609 recedes therein as the first device housing 102 and the second device housing 103 pivot about the hinge 101 to the closed position (200). This translation of the hinge housing plate 609 compensates for the difference between the length of the flexible display (121) that bends when the first device housing 102 pivots about the hinge 101 relative to the second device housing 103 to the closed position (200) and the length of the mechanical mechanism supporting the flexible display (121) that is defined by the first support plate 601, the second support plate 602, the hinge housing 201, and the hinge housing plate 609.

Figure 7:
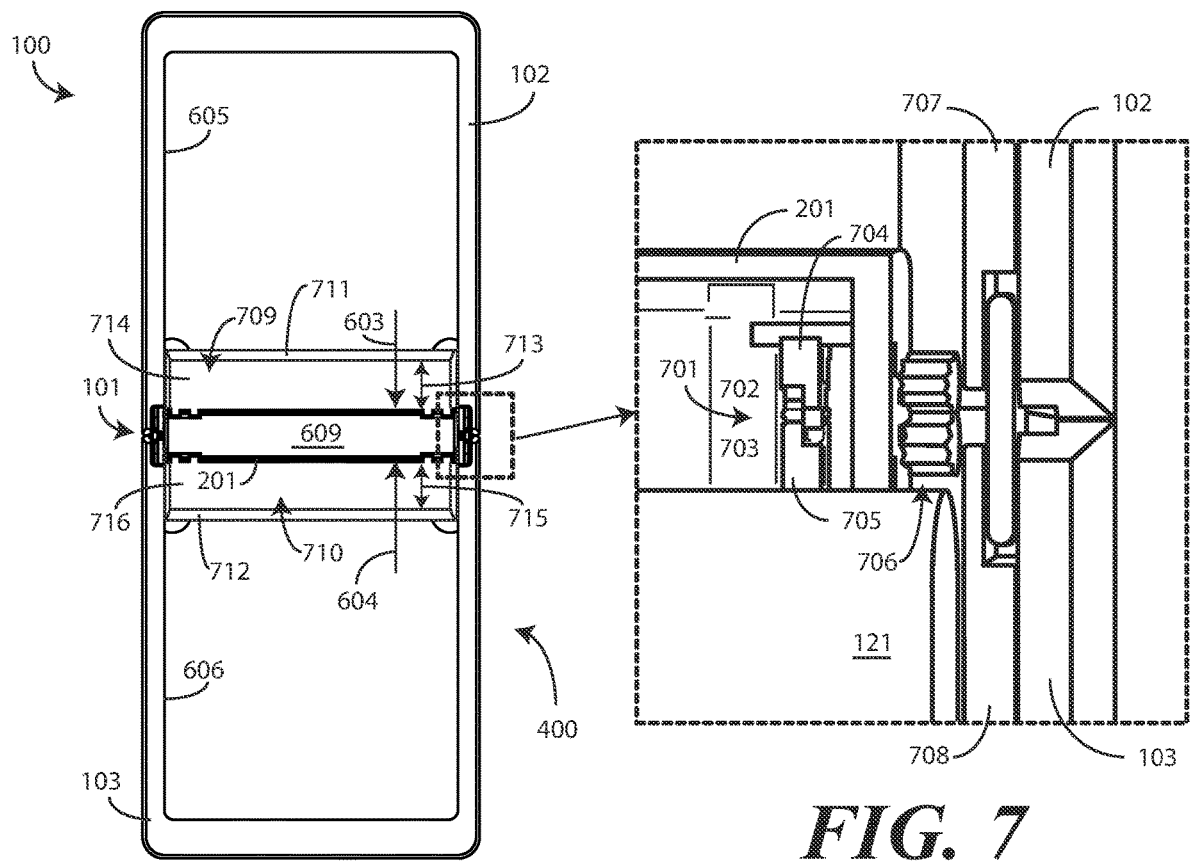
FIG. 7 illustrates one explanatory hinge mechanism in accordance with embodiments of the disclosure.

Turning now to FIG. 7, illustrated therein is an enlarged view of a portion of the hinge 101 so that some of the hinge components can be more easily seen. Additionally, the flexible display 121 is shown being peeled away in the enlarged view. In the view of FIG. 7, the hinge housing plate 609 has been removed so that some of the components situated within the hinge housing 201 can be more readily seen. These components will be shown in further detail below with reference to FIGS. 15-16.

In one or more embodiments, an actuator 701 is coupled between the hinge housing 201 and the hinge housing plate 609. In one or more embodiments, the actuator 701 causes translation of the hinge housing plate 609 within the hinge housing 201 as the first device housing 102 and second device housing 103 pivot between the axially displaced open position and the closed position. In the illustrative embodiment of FIG. 7, the actuator 701 comprises an X-shaped actuator, with a first actuator arm 702 interfacing with a second actuator arm 703 to define an X-shape with the first actuator arm 702 and the second actuator arm 703 moving in opposite directions with a scissor action to cause a first actuator arm end 704 and a second actuator arm end 705 to change position within the hinge housing 201.

In one or more embodiments, a pair of interlocking gears 706 are pivotally coupled within the hinge 101. Illustrating by example, in one or more embodiments the pair of interlocking gears 706 can be positioned about hinge housing pivot point posts such that they can rotate when the first device housing 102 and second device housing 103 pivot relative to the hinge housing 201. When one device housing pivots relative to the hinge housing 201 the interlocking gears 706 ensure the corresponding device housing also rotates as well.

In one or more embodiments the interlocking gears 706 comprise a first toothed wheel and a second toothed wheel that engage each other when the first device housing 102 pivots about the hinge housing 201 relative to the second device housing 103. The engagement of the first toothed wheel and the second toothed wheel of the interlocking gears 706 causes a symmetric angular rotation of the first device housing 102 and the second device housing 103 when the first device housing 102 pivots about the hinge housing 201 relative to the second device housing 103.

In one or more embodiments, a first hinge arm 707 is pivotally coupled to the hinge housing 201 and fixedly coupled to the first device housing 102. Similarly, a second hinge arm 708 is pivotally coupled to the hinge housing 201 and fixedly coupled to the second device housing 103. As the first hinge arm 707 and the second hinge arm 708 are pivotally coupled to the hinge housing 201, the first device housing 102 can pivot about the hinge housing 201 relative to the second device housing 103 between a closed position and an axially displaced open position.

In FIG. 7, the electronic device 100 of the non-enlarged view is shown with the first support plate (601) and the second support plate (602) removed so that additional details of the first device housing 102 and the second device housing 103 can more readily be seen. As shown in FIG. 7, in one or more embodiments each of the first device housing 102 and the second device housing 103 define a first chamber 709 and a second chamber 710, respectively.

In this illustrative embodiment, the first chamber 709 of the first device housing 102 is disposed to a first side 603 of the hinge housing 201, while the second chamber 710 of the second device housing 103 is disposed to the second side 604 of the hinge housing 201. The hinge housing 201 then separates the first chamber 709 defined by the first device housing 102 from the second chamber 710 defined by the second device housing 103.

In one or more embodiments, the first chamber 709 and the second chamber 710 provide recessed, open space within the first device housing 102 and the second device housing 103, respectively, that allows the flexible display 121 room to form a service loop when the first device housing 102 and the second device housing 103 pivot about the hinge 101 to the closed position (200). One example of such a service loop will be shown below with reference to FIG. 9. This service loop occurs due to the fact that the flexible display 121 deforms when the first device housing 102 pivots about the hinge 101 relative to the second device housing 103 from the axially displaced open position 400 to the closed position (200).

In one or more embodiments, each of the first chamber 709 and the second chamber 710 comprises an inclined plane 711,712. In this illustrative embodiment, the first chamber 709 defines an inclined plane 711 that is disposed distally a predefined distance 713 across a bottom surface 714 of the first chamber 709 from the hinge housing 201. Similarly, the second chamber 710 defines an inclined plane 712 that is disposed distally a predefined distance 715 across a bottom surface 716 of the second chamber 710 from the hinge housing 201.

In this illustrative embodiment, the first device housing 102 and the second device housing 103 each define linear recesses 605,606 into which a display may be positioned. In such an embodiment, each of the first chamber 709 and the second chamber 710 is disposed between a respective linear recess 605,606 and the hinge 101. For example, in this illustrative embodiment the first chamber 709 of the first device housing 102 is disposed between the linear recess 605 of the first device housing 102 and the hinge 101. Similarly, the second chamber 710 of the second device housing 103 is disposed between the linear recess 606 of the second device housing 103 and the hinge 101.

While shown as flat surfaces spanning the width of the first chamber 709 and the second chamber 710, respectively, in FIG. 7, it should be noted that the inclined planes 711,712 could be augmented with, or replaced by, other inclined plane structures. Illustrating by example, turning now to FIG. 8, in this illustrative embodiment each of the first support plate 601 and the second support plate 602 is bounded by inclined apertures 801,802,803,804 within which posts extending distally from the edges of the first support plate 601 and second support plate 602 insert. This configuration latches and retains the posts within the inclined apertures 801,802,803,804, thereby defining an enclosed track within which the posts may travel as the electronic device 100 pivots between the axially displaced open position (400) and the closed position (200).

Figure 8:
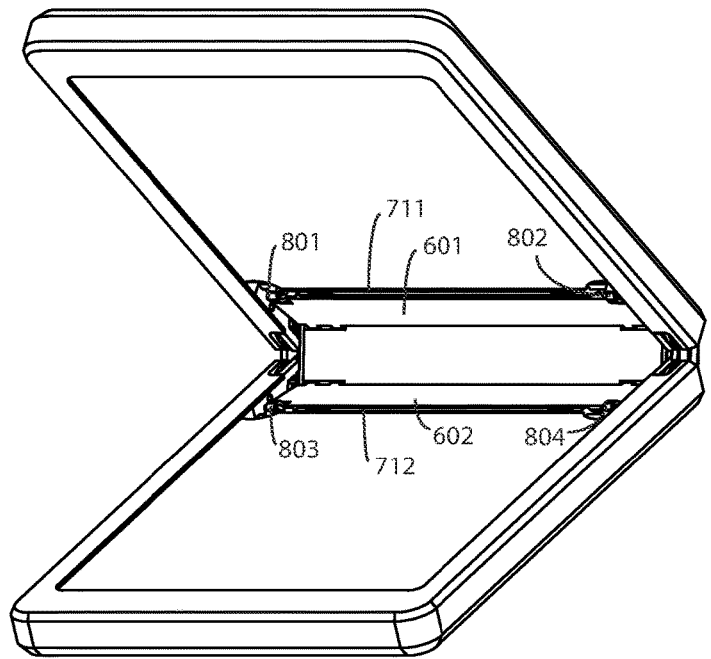
FIG. 8 illustrates a perspective view of one explanatory electronic device in accordance with embodiments of the disclosure in a partially open position, and with the flexible display removed so that the hinge is visible.

In the illustrative embodiment of FIG. 8, the inclined apertures 801,802,803,804 are included in addition to the inclined planes 711,712. However, in other embodiments the inclined apertures 801,802,803,804 will be omitted. In still other embodiments, the inclined apertures 801,802,803,804 will replace the inclined planes 711,712.

Figure 9:
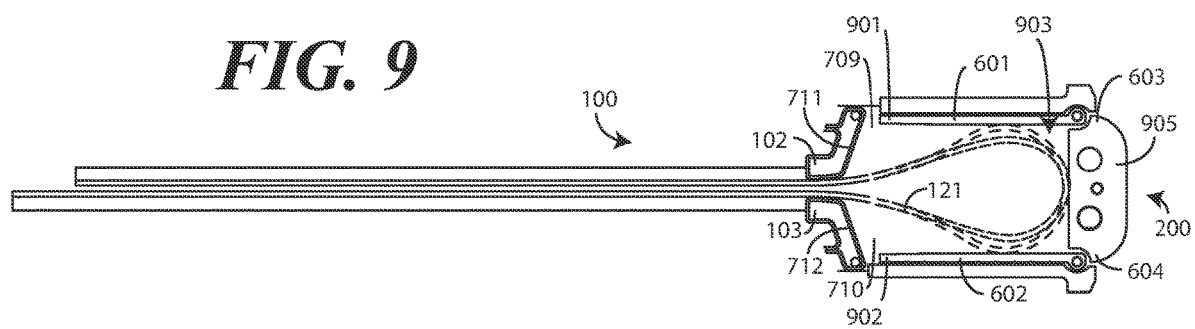
FIG. 9 illustrates a cut away view of a hinge portion of an electronic device in accordance with one or more embodiments of the disclosure when the electronic device is in the closed position.

Turning now to FIG. 9, illustrated therein is a partial cut away view of the electronic device 100 showing the mechanical mechanism facilitating support of the flexible display 121 during bending operations. In this illustration, the flexible display 121 is positioned within the first chamber 709 and second chamber 710 of the first device housing 102 and the second device housing 103, respectively. As shown, the first device housing 102 defines the first chamber 709, while the second device housing 103 defines the second chamber 710.

As shown in FIG. 9, the first device housing 102 and the second device housing 103 have been pivoted about a hinge housing 905 to a closed position 200. (For illustrative purposes to show issues occurring with the path length of the flexible display 121, the hinge housing 905 of FIG. 9 is solid and does not include the hinge housing plate (609) previously described.) In one or more embodiments, when this occurs, a distal end 901,902 of each of the first support plate 601 and the second support plate 602 travels along its respective inclined plane 711,712 between a first position (shown in FIG. 10) within the first device housing 102 and the second device housing 103, respectively, to a second position (shown in FIG. 9) within the first device housing 102 and the second device housing 103, respectively.

Figure 10:
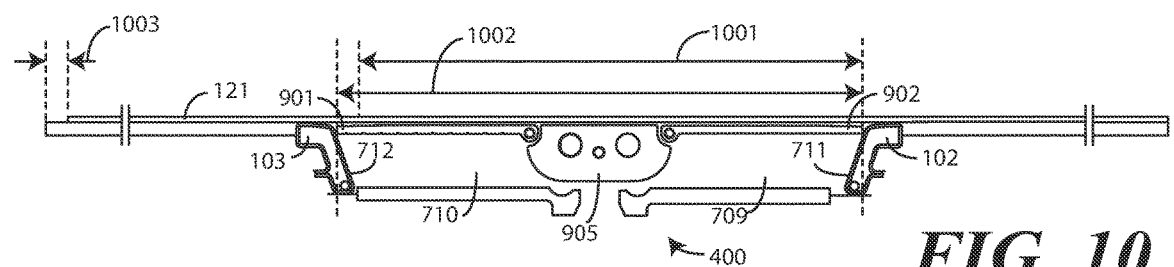
FIG. 10 illustrates a cut away view of a hinge portion of an electronic device in accordance with one or more embodiments of the disclosure when the electronic device is in the axially displaced open position.

The distal ends 901,902 of each of the first support plate 601 and the second support plate 602 therefore travel, in one or more embodiments, along their respective inclined planes 711,712 through the first chamber 709 and the second chamber 710 between the first position of FIG. 10 within the first device housing 102 and the second device housing 103, respectively, to the second position of FIG. 9 within the first device housing 102 and the second device housing 103, respectively, when the first device housing 102 and the second device housing 103 pivot about the hinge housing 905 from an axially displaced open position (400) to the closed position 200 of FIG. 9. When this occurs, the first support plate 601, the hinge housing 905, and the second support plate 602 define boundaries within which the flexible display 121 defines a service loop 903.

The area opened for the service loop 903 by the translation of the first support plate 601 and the second support plate 602, in one embodiment, provides a radius that is sufficient to prevent the flexible display 121 from kinking or folding. The opened area also works to minimize mechanical memory problems when the first device housing 102 and the second device housing 103 pivot about the hinge housing 905 to the open position 400.

As described above, the first support plate 601 is pivotally coupled to a first side 603 of the hinge housing 905 The first support plate 601 extends distally into the first chamber 709 from the first side 603 of the hinge housing 905. Similarly, the second support plate 602 is pivotally coupled to a second side 604 of the hinge housing 905. The second support plate 602 extends distally into the second chamber 710 from the second side 604 of the hinge housing 905. The distal end 901 of the first support plate 601 and the distal end 902 of the second support plate 602 each travel along its respective inclined plane 711,712 between a first position within the first chamber 709 and the second chamber 710, respectively, as shown in FIG. 10, to a second position within the first chamber 709 and the second chamber 710, respectively, as shown in FIG. 9, when the first device housing 102 and the second device housing 103 pivot about the hinge housing 905 from the axially displaced open position 400 to the closed position 200.

The translation of the first support plate 601 and the second support plate 602 along the inclined planes 711,712 from a shallow position (FIG. 10) within the first device housing 102 and the second device housing 103, to the deep position within the first device housing 102 and the second device housing 103 shown in FIG. 9, when the first device housing 102 pivots about the hinge housing 905 relative to the second device housing 103 from the axially displaced open position (400) to the closed position 200, results in the first support plate 601 and the second support plate 602 abutting the outer major face of the flexible display 121 when the first device housing 102 and the second device housing 103 are in the closed position 200.

Turning now to FIG. 10, the first device housing 102 and the second device housing 103 have been rotated about the hinge housing 905 to the axially displaced open position 400. When this occurs, due to the action of the hinge housing 905, the distal ends 901,902 of the first support plate 601 and the second support plate 602 translate up their respective inclined planes 711,712, through the first chamber 709 and the second chamber 710, from the second position of FIG. 9 to the first position shown in FIG. 10. In the illustrative embodiment of FIG. 10, when the distal ends 901,902 of the first support plate 601 and the second support plate 602 fully translate up their respective inclined planes 711,712 from the second position of FIG. 9 to the first position shown in FIG. 10, they sit atop ends of the inclined planes 711,712.

In this position, and as shown in FIG. 10, when the distal ends 901,902 of the first support plate 601 and the second support plate 602 fully translate up their respective inclined planes 711,712 from the second position of FIG. 9 to the first position shown in FIG. 10, the first support plate 601, the hinge housing 905, and the second support plate 602 bridge the linear recess (605) of the first device housing 102 and the linear recess (606) of the second device housing 103 when the first device housing 102 and the second device housing 103 are in an axially displaced open position 400 shown in FIG. 10. Since the distal ends 901,902 of the first support plate 601 and the second support plate 602 have translated up their respective inclined planes 711,712 from the second position of FIG. 9 to the first position shown in FIG. 10, the first support plate 601, the second support plate 602, and the hinge housing 905 work in tandem to mechanically support the flexible display 121.

By comparing FIGS. 9 and 10, it can be seen that when the flexible display 121 is fixedly coupled to the first device housing 102 and also fixedly coupled to the second device housing 103, with the first device housing 102, hinge housing 905 (which is solid in FIGS. 9-10 for illustrative purposes), and second device housing 103 configured to cause the flexible display 121 to extend and become substantially planar when the first device housing 102 and second device housing 103 are in the axially displaced open position 400, the path length 1002 of the mechanical mechanism defined by the first support plate 601, the second support plate 602, and the hinge housing 905 can be different than the path length 1001 of the section of the flexible display 121 that bends when each is in the closed position 200. Said differently, where the flexible display 121 is configured to extend flat when in the axially displaced open position 400, when the folding mechanism is in the closed position 200 the length 1001 of the service loop 903 defined by the flexible display 121 and the mechanical boundaries defined by the first support plate 601, hinge housing 905, and second support plate 602 may be different.

In particular, to provide sufficient room for the service loop 903, the mechanical mechanism defined by the first support plate 601, the hinge housing 905, and the second support plate 602 may be longer than the length 1001 of the flexible display 121 that bends to define the service loop 903 by a predefined amount. This difference 1003 in length can be problematic in that it can result in either deformations in the service loop 903 when the mechanism is in the closed position 200, or alternatively it can result in mechanical strain or unevenness in the flexible display 121 when the mechanism is in the axially displaced open position 400.

While a spring-loaded plate can be used to apply tension to one end of the flexible display to compensate for the distance difference 1003 as noted above, embodiments of the disclosure provide an improved hinge mechanism that allows for the flexible display 121 to be fixedly connected to the first device housing 102 and second device housing 103, respectively, as well as to fully extend when the mechanism is in the axially displaced open position 400. At the same time, the hinge mechanism allows the flexible display 121 form a proper service loop 903 when the mechanism is in the closed position 200.

Embodiments of the disclosure accomplish this by employing a hinge mechanism that includes a hinge housing plate (609) situated within a hinge housing (201) that is not solid like the hinge housing 905 of FIGS. 9-10. The hinge housing plate (609) is therefore able to translate within the hinge housing (201) between a first position and a second position when the first device housing 102 and the second device housing 103 pivot about the hinge housing (201) from the axially displaced open position 400 to the closed position 200. By translating into the hinge housing (201), i.e., by translating from the first position to the second position, which is situated deeper into the hinge housing (201) than the first position, a recess is created that allows at least a portion of the service loop 903 of the flexible display 121 to situate within the hinge housing (201) when the first device housing 102 and the second device housing 103 are in the closed position 200. This recess is removed when the hinge housing plate (609) translates back to the first position, thereby allowing the hinge housing (201) and the hinge housing plate (609) to define a bridge mechanically supporting the flexible display 121 when the first device housing 102 and the second device housing 103 are in the axially displaced open position 400.

Figure 11:
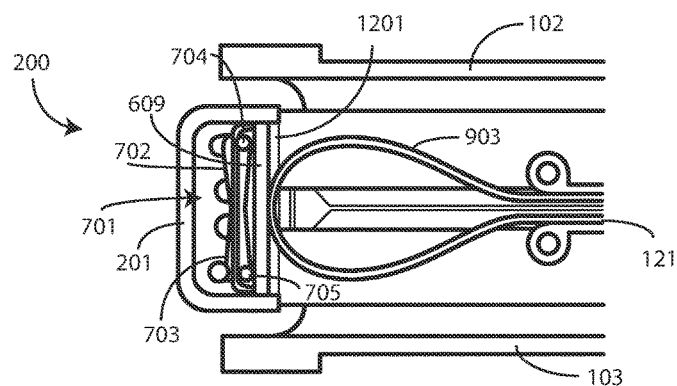
FIG. 11 illustrates a portion of one explanatory hinge mechanism in accordance with one or more embodiments of the disclosure when the hinge mechanism is in the closed position.
Figure 12:
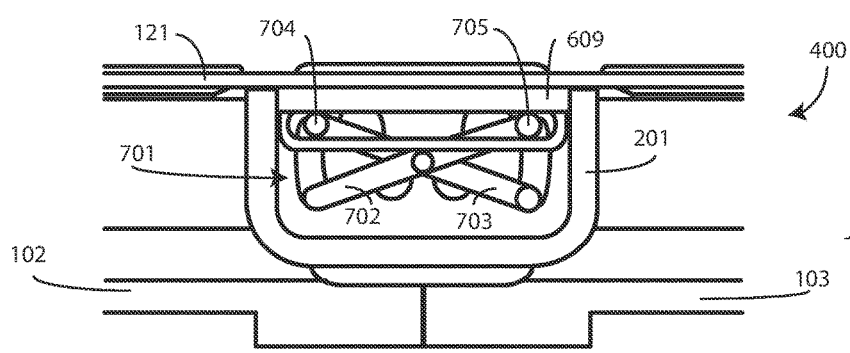
FIG. 12 illustrates the portion of the explanatory hinge mechanism of FIG. 11 in the axially displaced open position.

This action is illustrated in FIGS. 11 and 12. Beginning with FIG. 11, the first device housing 102 and the second device housing 103 have been pivoted to the closed position 200. The hinge housing plate 609 has translated into the hinge housing 201 to the second position, thereby creating a recess 1201 within the hinge housing 201. As shown, the service loop 903 of the flexible display 121 is thus able to situate within the recess 1201. Said differently, the use of the hinge housing plate 609 allows at least a portion of the service loop 903 of the flexible display 121 to situate within an interior region of the hinge housing 201 when the first device housing 102 and the second device housing 103 are pivoted to the closed position 200.

By contrast, when the first device housing 102 and the second device housing 103 pivot to the axially displaced open position 400 of FIG. 12, the hinge housing plate 609 translates within the hinge housing from the second position of FIG. 11 to the first position. In one or more embodiments, this causes the hinge housing plate 609 to sit flush with the distal ends of the sidewalls of the hinge housing 201 when the first device housing 102 and the second device housing 103 are pivoted to the axially displaced open position 400. This allows the hinge housing 201 and the hinge housing plate 609 to define a bridge mechanically supporting the flexible display 121 when the first device housing 102 and the second device housing 103 are in the axially displaced open position 400.

By comparing FIG. 11 and FIG. 12, it can be seen that the hinge mechanism changes an amount of area within the hinge housing 201 via translation of the hinge housing plate 609. Said differently, as a result of the hinge housing plate 609 receding into the hinge housing 201 in FIG. 11, the path length available for the flexible display 121 changes between the axially displaced open position 400 of FIG. 12 and closed position 200 of FIG. 11. Effectively, the hinge assembly of FIGS. 11-12 causes the hinge housing plate 609 to translate closer to the distal ends of the sidewalls of the hinge housing 201 when the electronic device is in the axially displaced open position 400, and farther from the distal ends of the sidewalls of the hinge housing 201 when the electronic device is in the closed position 200. This translation of the hinge housing plate 609 compensates for the difference between the bending length of the flexible display 121 and the length of the mechanical mechanism supporting the flexible display 121.

As shown in FIGS. 11-12, in this illustrative embodiment the hinge housing 201 defines a hinge housing plate receiving recess in which the hinge housing plate 609 can translate. The hinge housing plate 609 travels within the hinge housing 201 between a first position within the hinge housing 201 (FIG. 12) to a second position within the hinge housing 201 (FIG. 11) when the first device housing 102 and the second device housing 103 pivot from the axially displaced open position 400 to the closed position 200. The hinge housing plate 609 moves into the hinge housing 201 when the first device housing 102 and second device housing 103 pivot to the closed position 200, and then moves outward from an inner surface of the hinge housing 201 when the first device housing 102 and second device housing 103 pivot about to the axially displaced open position 400. This allows the hinge housing 201 and the hinge housing plate 609 to define a bridge mechanically supporting the flexible display 121 when the first device housing 102 and the second device housing 103 are in the axially displaced open position 400, as shown in FIG. 12. However, when the first device housing 102 and the second device housing 103 are pivoted to the closed position 200, the translation of the hinge housing plate 609 into the hinge housing 201 allows at least a portion of the service loop 903 formed by the flexible display 121 to situate within the hinge housing 201, as shown in FIG. 11.

Also shown in FIG. 12 is the actuator 701 described above with reference to FIG. 7. In this illustrative embodiment, the actuator 701 is coupled between the hinge housing 201 and the hinge housing plate 609. The actuator 701 causes translation of the hinge housing plate 609 within the hinge housing 201 as the first device housing 102 and second device housing 103 pivot between the axially displaced open position 400 and the closed position 200.

In this illustrative embodiment, the actuator 701 comprises an X-shaped actuator. The X-shape is formed by a first actuator arm 702 that interfaces with a second actuator arm 703 to define an X-shape. Pins extending from a first actuator arm end 704 and a second actuator arm end 705 situate within a bounded slot coupled to the hinge housing plate 609. Other pins extending from another first actuator arm end and another second actuator arm end then situate within curved slots defined by the hinge housing 201. A comparison of FIG. 11 and FIG. 12 illustrates that motion of the first actuator arm 702 in an opposite direction of the second actuator arm 703, when the pins of each actuator arm are situated within their respective slot shown in these figures, causes a scissoring action to occur. This scissoring action causes first actuator arm end 704 and a second actuator arm end 705 to change position within the hinge housing 201. To wit, the first actuator arm end 704 and the second actuator arm end 705 get farther away from the interior surface of the hinge housing 201 when the first device housing 102 and the second device housing 103 move to the axially displaced open position 400, thereby elevating the hinge housing plate 609 out of the hinge housing 201. However, the first actuator arm end 704 and the second actuator arm end 705 move closer to the interior surface of the hinge housing 201 when the first device housing 102 and the second device housing 103 move to the closed position 200, thereby drawing the hinge housing plate 609 into the hinge housing 201.

Figure 13:
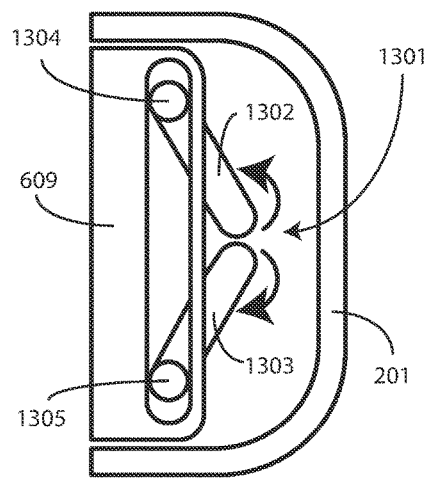
FIG. 13 illustrates one explanatory hinge actuator mechanism in accordance with one or more embodiments of the disclosure.
Figure 14:
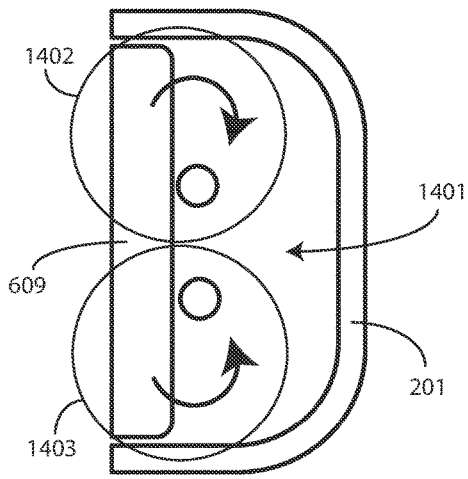
FIG. 14 illustrates another explanatory hinge actuator mechanism in accordance with one or more embodiments of the disclosure.

While an X-shaped actuator is one type of actuator suitable for elevating the hinge housing plate 609 out of the hinge housing 201 when the first device housing 102 and the second device housing 103 move to the axially displaced open position 400 and for drawing the hinge housing plate 609 into the hinge housing 201 when the first device housing 102 and the second device housing 103 move to the closed position 200, embodiments of the disclosure are not so limited. The actuator 701 can take other forms as well. Turning now to FIGS. 13-14, illustrated therein are alternative actuators. Still other actuators suitable for moving the hinge housing plate will be obvious to those of ordinary skill in the art having the benefit of this disclosure.

Beginning with FIG. 13, in this embodiment the actuator 1301 comprises a V-shaped actuator. As with the actuator (701) of FIGS. 11-12, the actuator 1301 of FIG. 13 is coupled between the hinge housing 201 and the hinge housing plate 609. The actuator 1301 causes translation of the hinge housing plate 609 within the hinge housing 201 as a first device housing and a second device housing coupled to the hinge housing 201 pivot between an axially displaced open position and a closed position.

The V-shape is formed by a first actuator arm 1302 that is adjacent to a second actuator arm 1303 at one end, thereby defining the V-shape. Pins extending from a first actuator arm end 1304 and a second actuator arm end 1305 situate within a bounded slot coupled to the hinge housing plate 609. Other pins extending from another first actuator arm end and another second actuator arm end then situate within apertures defined by the hinge housing 201. When device housings coupled to the hinge housing 201 pivot between an axially displaced open position and a closed position, motion of the first actuator arm 1302 in an opposite direction of the second actuator arm 1303, when one end of the first actuator arm 1302 and the second actuator arm 1303 are pivotally fixed with the pins of the first actuator arm end 1304 and the second actuator arm end 1305 situated within the bounded slot, causes another scissoring action to occur. This scissoring action causes first actuator arm end 1304 and a second actuator arm end 1305 to change position within the hinge housing 201. As before, the first actuator arm end 1304 and the second actuator arm end 1305 get farther away from the interior surface of the hinge housing 201, thereby causing the hinge housing plate 609 to translate to a first position when a first device housing and a second device housing coupled to the hinge housing 201 move to an axially displaced open position, thereby elevating the hinge housing plate 609 out of the hinge housing 201. However, the first actuator arm end 1304 and the second actuator arm end 1305 move closer to the interior surface of the hinge housing 201 when the first device housing and the second device housing move to the closed position, thereby drawing the hinge housing plate 609 into the hinge housing 201.

Turning now to FIG. 14, in this embodiment the actuator 1401 comprises a pair of oppositely rotating wheels 1402, 1403. The actuator 1401 of FIG. 14 is coupled between the hinge housing 201 and the hinge housing plate 609. The actuator 1401 causes translation of the hinge housing plate 609 within the hinge housing 201 as a first device housing and a second device housing coupled to the hinge housing 201 pivot between an axially displaced open position and a closed position.

Each wheel of the pair of oppositely rotating wheels 1402,1403 includes a pin situated against the hinge housing plate 609. When the pair of oppositely rotating wheels 1402,1403 rotate to move the pins toward the interior surface of the hinge housing 201, the hinge housing plate 609 is drawn into the hinge housing 201. By contrast, when the pair of oppositely rotating wheels 1402,1403 rotate in the opposite direction, thereby moving the pins away from the interior surface of the hinge housing 201, the hinge housing plate 609 is elevated out of the hinge housing 201. The rotation of the pair of oppositely rotating wheels 1402,1403 can be synchronized with the pivoting of a first device housing and second device housing coupled to the hinge housing 201, thereby causes translation of the hinge housing plate 609 within the hinge housing 201 as the first device housing and the second device housing coupled to the hinge housing 201 pivot between an axially displaced open position and a closed position as previously described.

Recall from FIG. 7 that in one or more embodiments the hinge mechanism includes a first hinge arm (707) coupling the hinge housing 201 to a first device housing (102) and a second hinge arm (708) coupling the hinge housing 201 to a second device housing (103). These linking arms are pivotable about the hinge housing 201, and by coupling to the first device housing (102) and second device housing (103), allow the latter device housings to pivot about the hinge housing 201 between the axially displaced open position (400) and the closed position (200). In one or more embodiments, regardless of which actuator of FIGS. 11-13 is used, be it an X-shaped actuator, a V-shaped actuator, a rotary actuator or other actuator, the linking arms cause actuation of the actuator arms in at least one direction.

An example of this will be described in more detail below with reference to FIG. 20.

However, in one or more embodiments, each of the first hinge arm (707) and the second hinge arm (708) includes a protruding pin that engages with the ends of the actuator arms (for the X-shaped and V-shaped actuators), or with the wheels of the rotary actuator to cause the same to move toward the inner surface of the hinge housing 201 when the first hinge arm (707) and the second hinge arm (708) pivot from the axially displaced open position (400) to the closed position (200), thereby drawing the hinge housing plate 609 into the hinge housing 201.

The protruding pins of the first hinge arm (707) and the second hinge arm (708) can be used to perform the opposite action of drawing the hinge housing plate 609 back outward from the interior of the hinge housing 201 as well in some embodiments. In other embodiments, a biasing element, one example of which is a spring, will be used to perform the opposite action. Illustrating by example, referring again to FIGS. 11 and 12, the protruding pins of first hinge arm (707) and the second hinge arm (708) can engage portions of the actuator 701 coupled between the hinge housing 201 and the hinge housing plate 609, thereby causing translation of the hinge housing plate 609 within the hinge housing 201 as the first device housing 102 and second device housing 103 pivot between the axially displaced open position 400 and the closed position 200. In one or more embodiments, a spring is included to bias the X-shaped actuator such that the first actuator arm 702 and the second actuator arm 703 extend outwardly from an interior surface of the hinge housing 201. The protruding pins of first hinge arm (707) and the second hinge arm (708) can engage the pins extending from a first actuator arm end 704 and a second actuator arm end 705 to flatten the X-shape (and compress the spring) when the first hinge arm (707) and the second hinge arm (708) pivot from the axially displaced open position 400 to the closed position 200. The spring can then elongate the X-shape when the first hinge arm (707) and the second hinge arm (708) pivot back to the axially displaced open position 400. The compression of the spring and flattening of the X-shape causes the first actuator arm end 704 and the second actuator arm end 705 to change position within the hinge housing 201. To wit, the spring biased against the first actuator arm end 704 and the second actuator arm end 705 cause the same to get farther away from the interior surface of the hinge housing 201 when the first hinge arm (707) and the second hinge arm (708) move to the axially displaced open position 400, thereby elevating the hinge housing plate 609 out of the hinge housing 201. However, the protruding pins of first hinge arm (707) and the second hinge arm (708) cause the first actuator arm end 704 and the second actuator arm end 705 move closer to the interior surface of the hinge housing 201, while compressing the spring, when the first hinge arm (707) and the second hinge arm (708) move to the closed position 200, thereby drawing the hinge housing plate 609 into the hinge housing 201.

In other embodiments, the opposite action can occur, as the spring or compression device is biased to draw the hinge housing plate 609 into the hinge housing 201. Illustrating by example, the protruding pins of first hinge arm (707) and the second hinge arm (708) can engage opposite portions (those situated closer to the interior surface of the hinge housing 201) of the actuator 701. The spring can then be included to bias the X-shaped actuator such that the first actuator arm 702 and the second actuator arm 703 compress inwardly toward the interior surface of the hinge housing 201. The protruding pins of first hinge arm (707) and the second hinge arm (708) can engage features extending from the first actuator arm 702 and the second actuator arm 703 at locations opposite the first actuator arm end 704 and a second actuator arm end 705 to extend the X-shape (and compress the spring) when the first hinge arm (707) and the second hinge arm (708) pivot from the closed position 200 to the axially displaced open position 400. The now compressed spring can then flatten the X-shape when the first hinge arm (707) and the second hinge arm (708) pivot back to the closed position 200. This approach has the advantage of engaging portions of the actuator 701 other than those that are situated within the bound slot to drive the hinge housing plate 609 in the appropriate direction. Again, this action will be illustrated in more detail in the subsequent figures, with particular detail shown in FIG. 20. This same pin-based manipulation in a first direction, and spring or other compression device manipulation in the opposite direction can be applied to any of the actuators of FIGS. 11-14.

Figure 15:
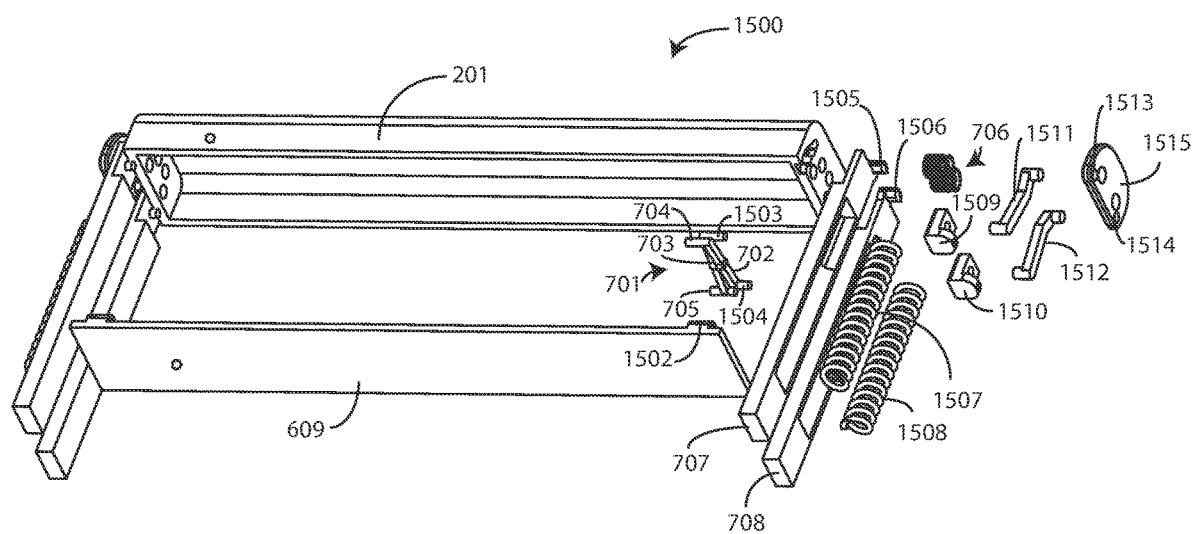
FIG. 15 illustrates an exploded perspective view of one explanatory hinge system in accordance with one or more embodiments of the disclosure.
Figure 16:
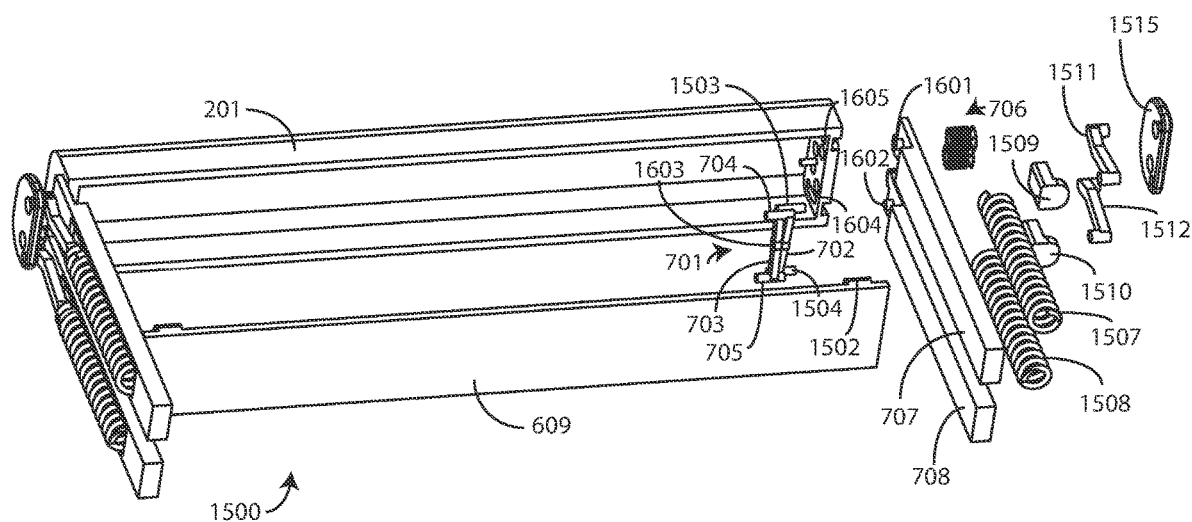
FIG. 16 illustrates another exploded perspective view of one explanatory hinge system in accordance with one or more embodiments of the disclosure.

With these general concepts understood from the basic embodiments described above, attention will now be turned to one explanatory implementation of the concept of FIGS. 11-12 to demonstrate one illustrative example of how the concept can be implemented in an electronic device. Turning now to FIGS. 15-16, illustrated therein are exploded views of one explanatory hinge assembly 1500 configured in accordance with one or more embodiments of the disclosure. In FIGS. 15-16, one side of the hinge assembly 1500 is shown in an exploded view, with the other side of the hinge assembly 1500 shown in an assembled view. While only one side of the hinge assembly 1500 will be described in the interest of brevity, it should be noted that the opposite side of the hinge assembly 1500 could be similarly constructed.

Note that in FIGS. 15-16, the first device housing (102) and second device housing (103) are not shown so that the elements of the hinge assembly 1500 can be more clearly seen. Had they been shown, the first hinge arm 707 would be fixedly coupled to the first device housing (102). Similarly, the second hinge arm 708 would be fixedly coupled to the second device housing (103).

As shown in these figures, in one or more embodiments the hinge assembly includes a hinge housing 201 and a hinge housing plate 609. An actuator 701 is coupled between the hinge housing 201 and the hinge housing plate 609. The actuator 701, which is an X-shaped actuator in this example, causes translation of the hinge housing plate 609 within the hinge housing 201 as a first actuator arm 702 interfacing with a second actuator arm 703 move in opposite directions to flatten and elongate the X-shape with reference to the interior surface of the hinge housing 201. This scissor action causes a first actuator arm end 704 and a second actuator arm end 705 to change position within the hinge housing 201.

As shown in FIGS. 15-16, a first actuator arm end 704 and a second actuator arm end 705 are configured with extension pins that situate within the bound slot 1502 of the hinge housing plate 609. In this illustrative embodiment, an opposite end 1503 of the first actuator arm 702 and an opposite end 1504 of the second actuator arm 703 include extension pins as well.

A first hinge arm 707 is pivotally coupled to the hinge housing 201. While not shown, the first hinge arm 707 would also be fixedly coupled to the first device housing (102). Similarly, a second hinge arm 708 is pivotally coupled to the hinge housing 201 and would be fixedly coupled to the second device housing (103). As the first hinge arm 707 and the second hinge arm 708 are pivotally coupled to the hinge housing 201, this allows the first device housing (102) coupled to the first hinge arm 707 to pivot about the hinge housing 201 relative to the second device housing (103) coupled to the second hinge arm 708 between a closed position and an axially displaced open position.

As shown in FIG. 16, each of the first hinge arm 707 and the second hinge arm 708 include an extension pin 1601, 1602 that engages with the extension pins of the opposite end 1503 of the first actuator arm 702 and an opposite end 1504 of the second actuator arm 703 to cause the X-shape of the actuator 701 to flatten and draw the hinge housing plate 609 into the hinge housing 201 when the first hinge arm 707 and the second hinge arm 708 pivot to the axially displaced open position. A spring 1603 can then be included to compress the X-shape when the first hinge arm 707 and the second hinge arm 708 pivot to the closed position as previously described.

Figure 27:
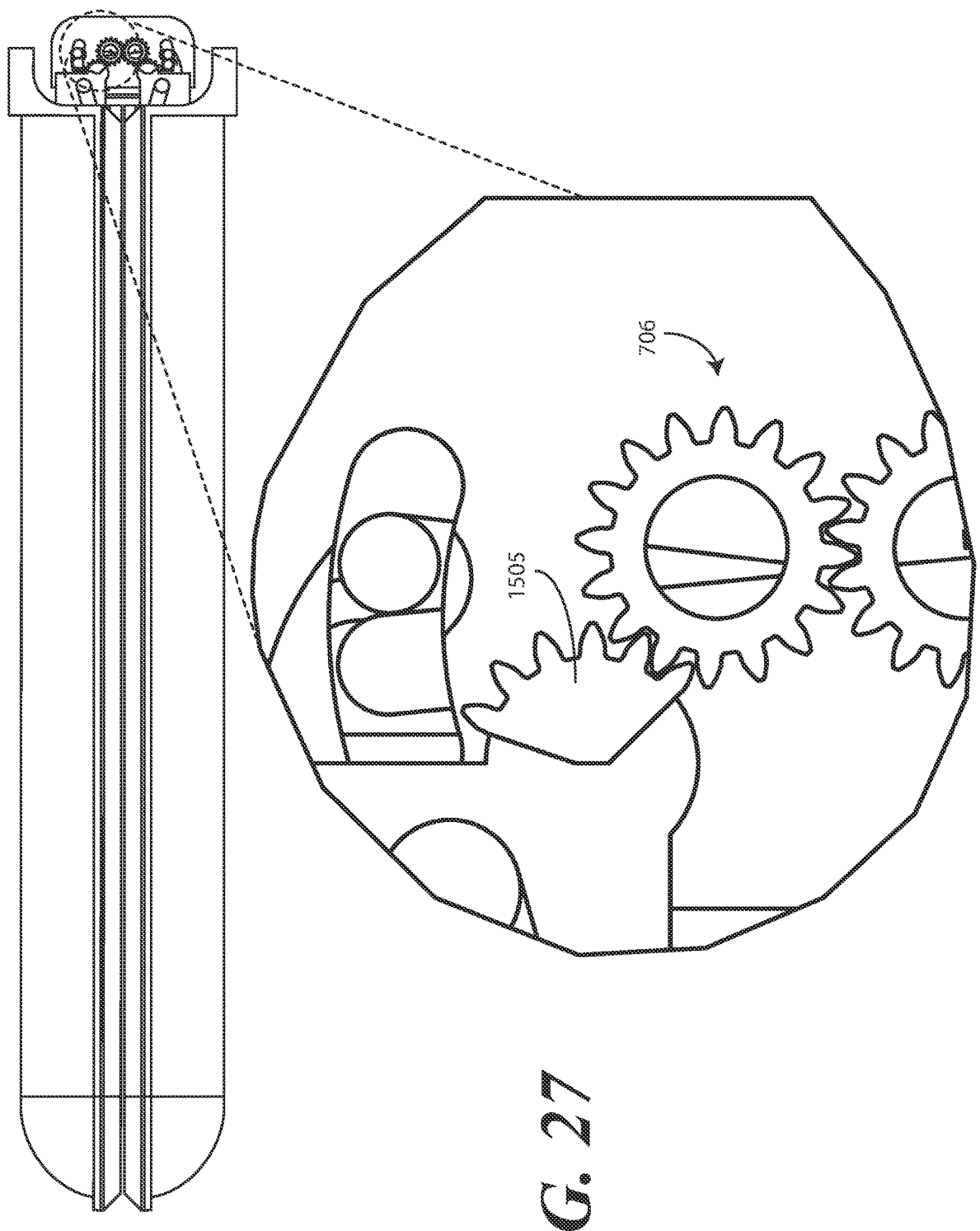
FIG. 27 illustrates one explanatory gear mechanism in accordance with one or more embodiments of the disclosure.

A pair of interlocking gears 706 situate against hinge housing gear posts 1505,1506 extending distally from the first hinge arm 707 and the second hinge arm 708. (How this occurs is shown in FIG. 27, wherein hinge housing gear post 1505 is shown engaging with the pair of interlocking gears.) Referring again to FIG. 7, this engagement allows the pair of interlocking gears 706 to rotate when the first hinge arm 707 and second hinge arm 708 pivot relative to the hinge housing 201. When one device housing pivots relative to the hinge housing 201 the interlocking gears 706 ensure the corresponding device housing also rotates as well. Moreover, the interlocking gears 706 cause this rotation of the first hinge arm 707 and the second hinge arm 708 to be symmetrical about the hinge housing 201 as well.

As shown in FIGS. 15-16, in one or more embodiments the interlocking gears 706 comprise a first toothed wheel and a second toothed wheel that engage each other when the first hinge arm 707 pivots about the hinge housing 201 relative to the second hinge arm 708. The engagement of the first toothed wheel and the second toothed wheel of the interlocking gears 706 causes a symmetric angular rotation of the first device housing (102) coupled to the first hinge arm 707 and the second device housing (103) coupled to the second hinge arm 708 when the second hinge arm 708 pivots about the hinge housing 201 relative to the second hinge arm 708.

In one or more embodiments, the first spring 1507 and a second spring 1508 are positioned within openings of the first hinge arm 707 and the second hinge arm 708, respectively. The first spring 1507 and second spring 1508 are biased between ends of these openings and a first spring compression ram 1509 and a second spring compression ram 1510. The first spring compression ram 1509 and a second spring compression ram 1510 are coupled to a first spring compression strut 1511 and a second spring compression strut 1512, respectively. Opposite ends of the first spring compression strut 1511 and a second spring compression strut 1512 situate within pivot apertures 1513,1514 of a sealing plate 1515 bounding the moving components of the hinge assembly 1500.

In this configuration, the first spring 1507 and the second spring 1508 bias the first spring compression ram 1509 and a second spring compression ram 1510, respectively, toward the hinge housing 201 as the first hinge arm 707 (and accordingly a first device housing (102) coupled thereto) and the second hinge arm 708 (and accordingly the second device housing (103) coupled thereto) pivot from the closed position to the axially displaced open position. Since the springs are least compressed when the first hinge arm 707 and the second hinge arm 708 are pivoted to the axially displaced open position, the action of the springs helps to retain the first hinge arm 707 and the second hinge arm 708 in the axially displaced open position. This action of the first spring 1507 and the second spring 1508 is shown illustratively in FIGS. 18, 21, and 24.

In one or more embodiments, the ends of the hinge housing 201 define engagement recesses 1604,1605 into which extension pins 1601,1602 of the first hinge arm 707 and the second hinge arm 708 can situate when the first hinge arm 707 and the second hinge arm 708 are coupled to the hinge housing 201. The interior surfaces of the hinge housing 201 then include curved slots into which the extension pins of the opposite end 1503 of the first actuator arm 702 and an opposite end 1504 of the second actuator arm 703 can situate. When the first hinge arm 707 and the second hinge arm 708 pivot to the axially displaced open position, the extension pins 1601,1602 of the first hinge arm 707 and the second hinge arm 708 engage the extension pins of the opposite end 1503 of the first actuator arm 702 and an opposite end 1504 of the second actuator arm 703, thereby causing the X-shape of the actuator 701 to extend and elevate the hinge housing plate 609 out of the hinge housing 201. The spring 1603 can then compress the X-shape when the first hinge arm 707 and the second hinge arm 708 pivot to the closed position as previously described.

Figure 17:
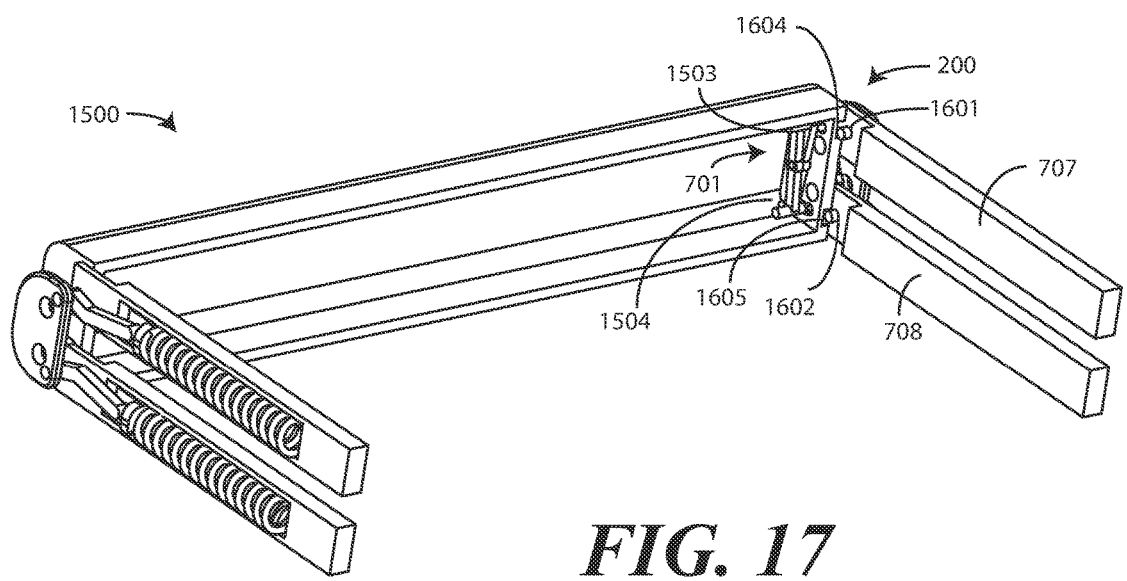
FIG. 17 illustrates an assembled perspective view of one explanatory hinge system in accordance with one or more embodiments of the disclosure.
Figure 18:
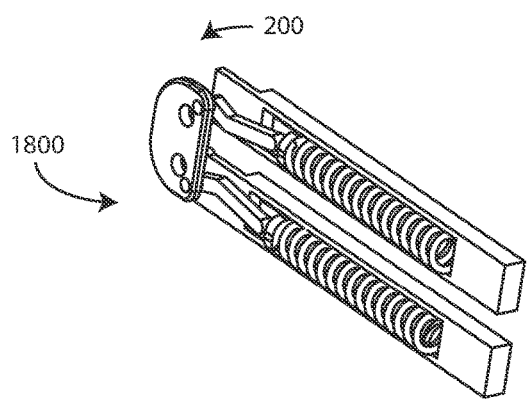
FIG. 18 illustrates a perspective view of one explanatory hinge actuator mechanism in accordance with one or more embodiments of the disclosure.
Figure 19:
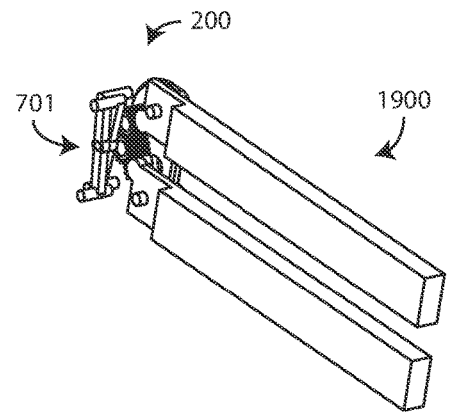
FIG. 19 illustrates another perspective view of one explanatory hinge actuator mechanism in accordance with one or more embodiments of the disclosure.
Figure 20:
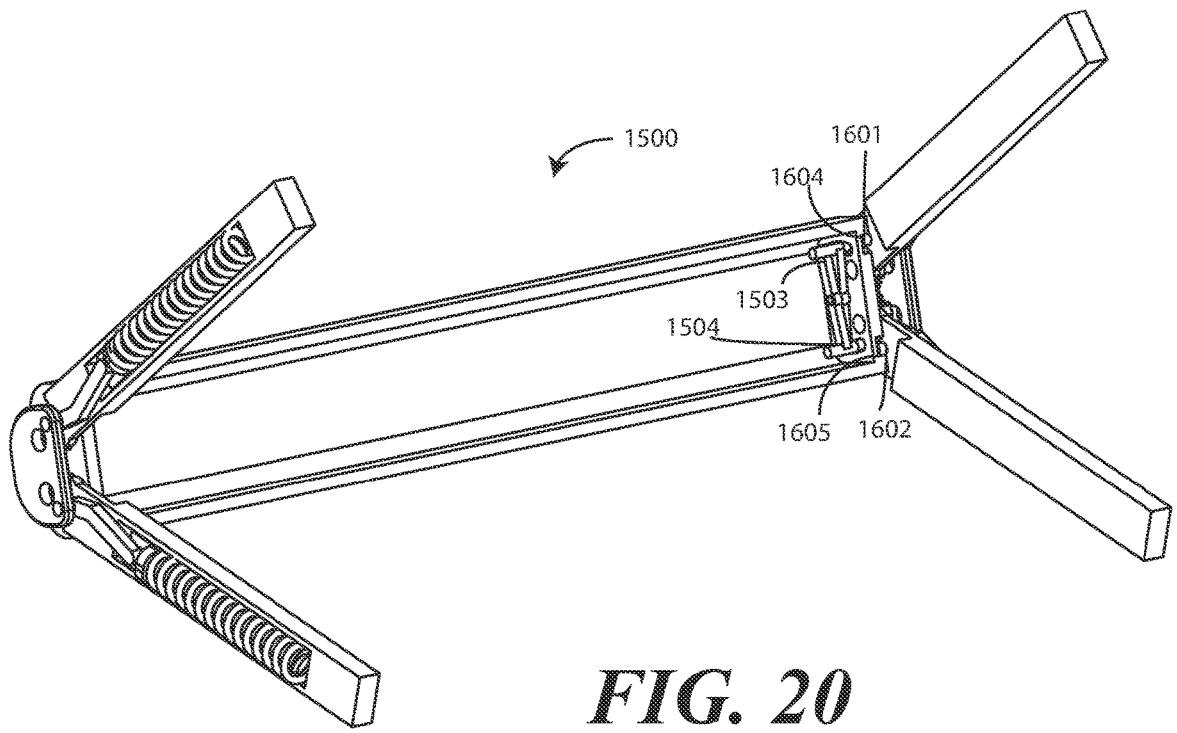
FIG. 20 illustrates a perspective view of one explanatory hinge system in accordance with one or more embodiments of the disclosure when in the partially open position.
Figure 21:
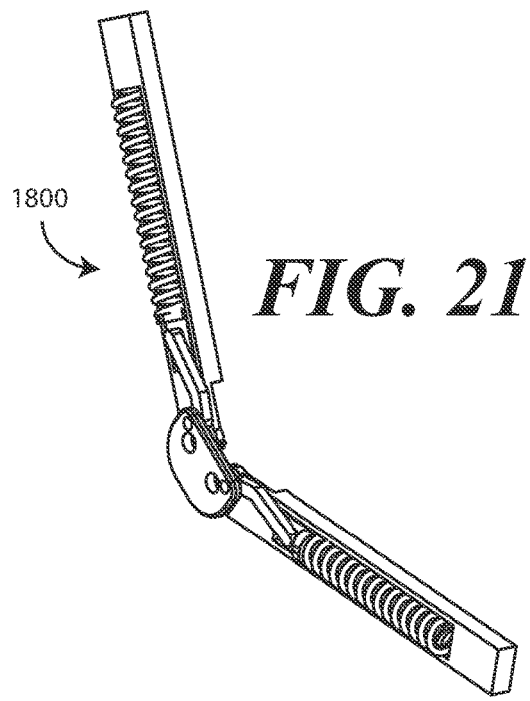
FIG. 21 illustrates a perspective view of one explanatory hinge actuator mechanism in a partially open position.
Figure 22:
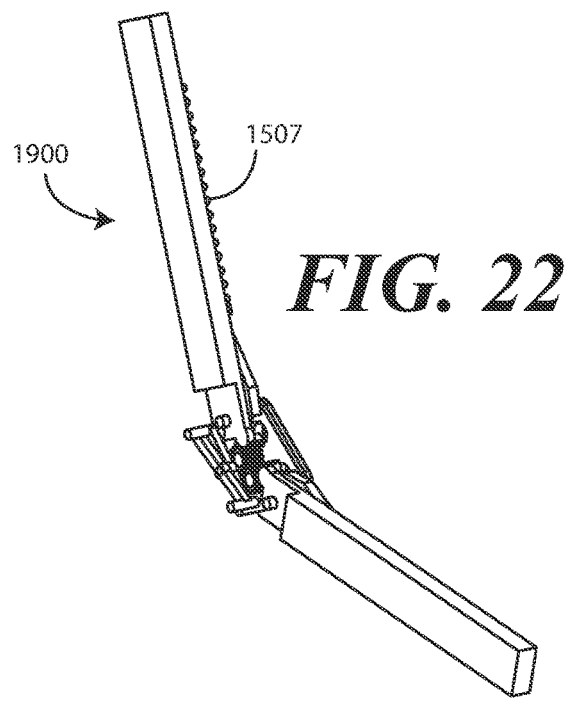
FIG. 22 illustrates another perspective view of one explanatory hinge actuator mechanism in a partially open position.
Figure 23:
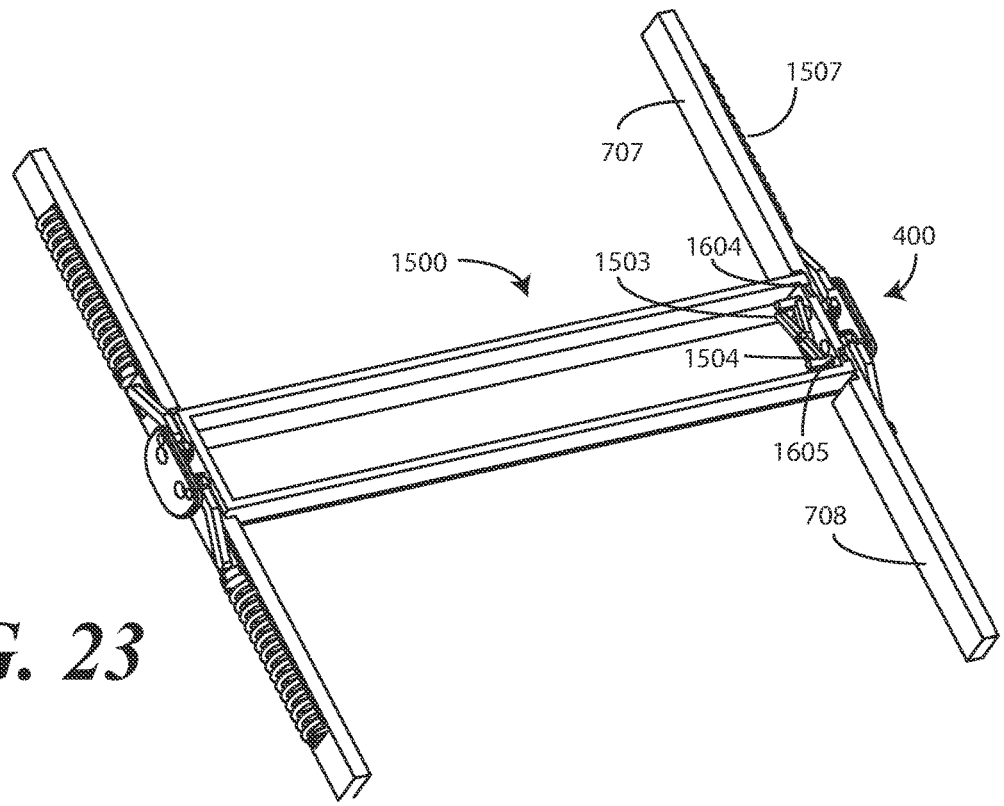
FIG. 23 illustrates a perspective view of one explanatory hinge system in accordance with one or more embodiments of the disclosure when in the axially displaced open position.

This is operation, as well as the other operations and functions of the hinge assembly 1500, is shown in FIGS. 17-25. FIG. 17 illustrates the hinge assembly 1500 shown in an assembled configuration, but with the hinge housing plate (609) removed so that the interior components, and in particular the actuator 701, can be more readily seen. The hinge assembly 1500 is shown with the first hinge arm 707 and the second hinge arm 708 in the closed position 200 in FIG. 17, while FIG. 20 illustrates the hinge assembly 1500 in a partially open position. FIG. 23 illustrates the hinge assembly 1500 with the first hinge arm 707 and the second hinge arm 708 in the axially displaced open position 400.

FIGS. 18 and 19 illustrate left and right partial hinge assemblies 1800,1900, respectfully, which effectively illustrate the left and right sides of the hinge assembly (1500) of FIG. 17 with the hinge housing (201) removed so that the actuator, gear, and hinge arm operation can more readily be seen. FIGS. 18 and 19 illustrate the left and right partial hinge assemblies 1800,1900 in the closed position 200, while FIGS. 21-22 illustrate the left and right partial hinge assemblies 1800,1900 in a partially open position. FIGS. 24-25 illustrate the left and right partial hinge assemblies 1800,1900 in the axially displaced open position 400.

As shown in FIGS. 17, 20, and 23, the extension pins 1601,1602 of the first hinge arm 707 and the second hinge arm 708 are situated within the engagement recesses 1604, 1605 defined in the ends of the hinge housing 201. The extension pins of the opposite end 1503 of the first actuator arm 702 and an opposite end 1504 of the second actuator arm 703 are situated into the curved slots defined by the interior surfaces of the hinge housing 201.

When the first hinge arm 707 and the second hinge arm 708 pivot to the axially displaced open position 400 of FIG. 23, the extension pins (1601,1602) of the first hinge arm 707 and the second hinge arm 708 engage the extension pins of the opposite end 1503 of the first actuator arm 702 and an opposite end 1504 of the second actuator arm 703, thereby causing the X-shape of the actuator 701 to extend and elevate the hinge housing plate (609) out of the hinge housing 201. By contrast, when the first hinge arm 707 and the second hinge arm 708 pivot to the closed position 200 of FIG. 17, the spring (1603) can then compress the X-shape, which draws the hinge housing plate (609) back into the hinge housing 201. The compression of the actuator 701 is best seen in FIG. 19, while the extension of the actuator 701 is shown in FIG. 26.

These figures also illustrate the operation of the first spring 1507 and a second spring 1508 when positioned within openings of the first hinge arm 707 and the second hinge arm 708 (this can actually be seen using the left side assembly). The first spring compression ram (1509) and a second spring compression ram (1510) bias the first spring 1507 and the second spring 1508 against ends of these openings. As best seen by comparing FIGS. 18, 21, and 24, the first spring (1507) and the second spring (1508) bias the first spring compression ram (1509) and a second spring compression ram (1510), respectively, toward the hinge housing (210) as the first hinge arm 707 and the second hinge arm 708 pivot from the closed position 200 to the axially displaced open position 400. Since the springs are least compressed when the first hinge arm 707 and the second hinge arm 708 are pivoted to the axially displaced open position 400 shown in FIG. 24, the action of the springs helps to retain the first hinge arm 707 and the second hinge arm 708 in the axially displaced open position 400. These figures also illustrate the operation of the pair of interlocking gears 706, which cause the first hinge arm 707 and the second hinge arm 708 to pivot in a symmetrical fashion relative to the hinge housing 201.

As mentioned above, however, not all electronic devices configured in accordance with embodiments of the disclosure employ flexible displays. Accordingly, in other applications it may be desirous to use the hinge mechanisms described above in an electronic device having rigid displays. One such example is shown in FIG. 26.

Figure 26:
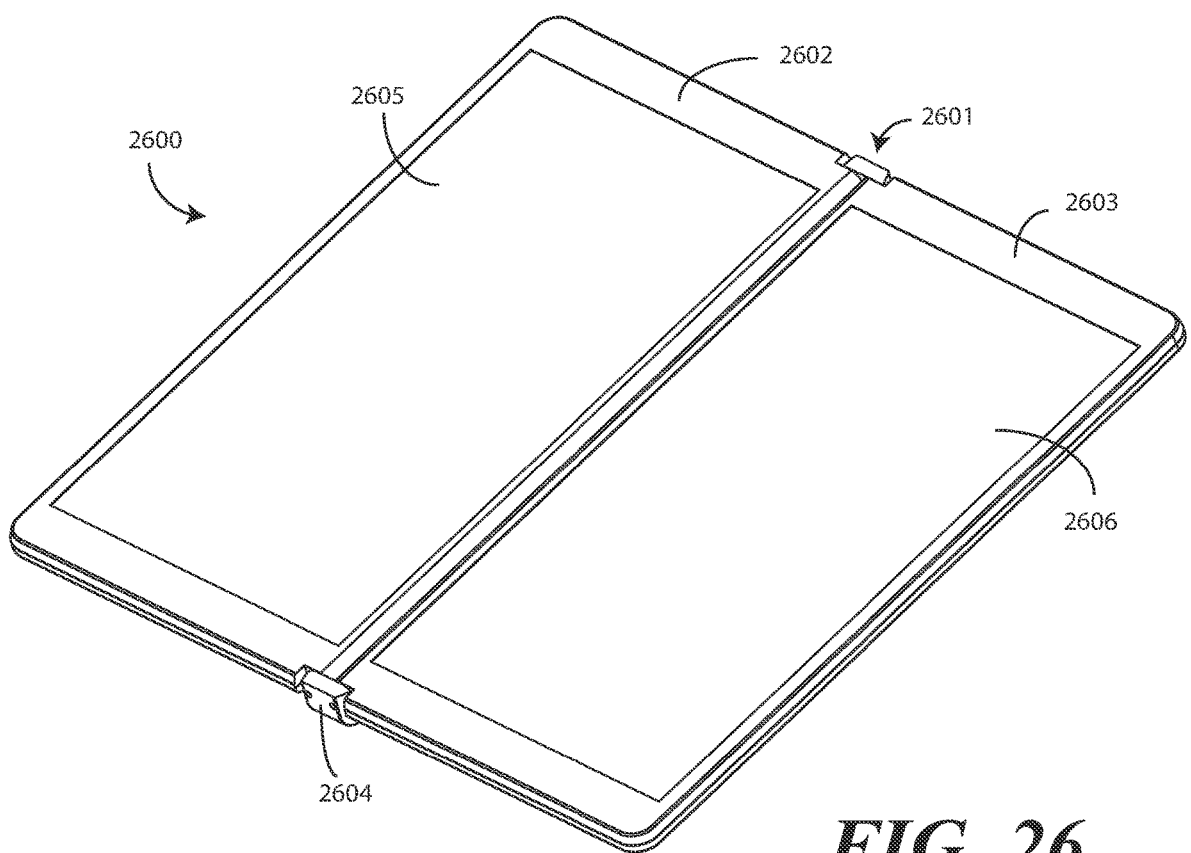
FIG. 26 illustrates an alternate electronic device configured in accordance with one or more embodiments of the disclosure.

Turning now to FIG. 26, illustrated therein is one embodiment where the flexible display and support plates are omitted. As shown in FIG. 26, an electronic device 2600 includes a first device housing 2602 and a second device housing 2603. A hinge 2601, which comprises a hinge body 2604, couples the first device housing 2602 to the second device housing 2603. The first device housing 2602 is pivotable about the hinge 2601 relative to the second device housing 2603 between an axially displaced open position and a closed position, as previously described.

Rather than having a flexible display, in this embodiment the electronic device 2600 includes a first display 2605 coupled to the first device housing 2602 and a second display 2606 coupled to the second device housing 2603. Thus, in addition to separating the first device housing 2602 from the second device housing 2603, the hinge 2601 separates the first display 2605 from the second display 2606 as well.

Figure 28:
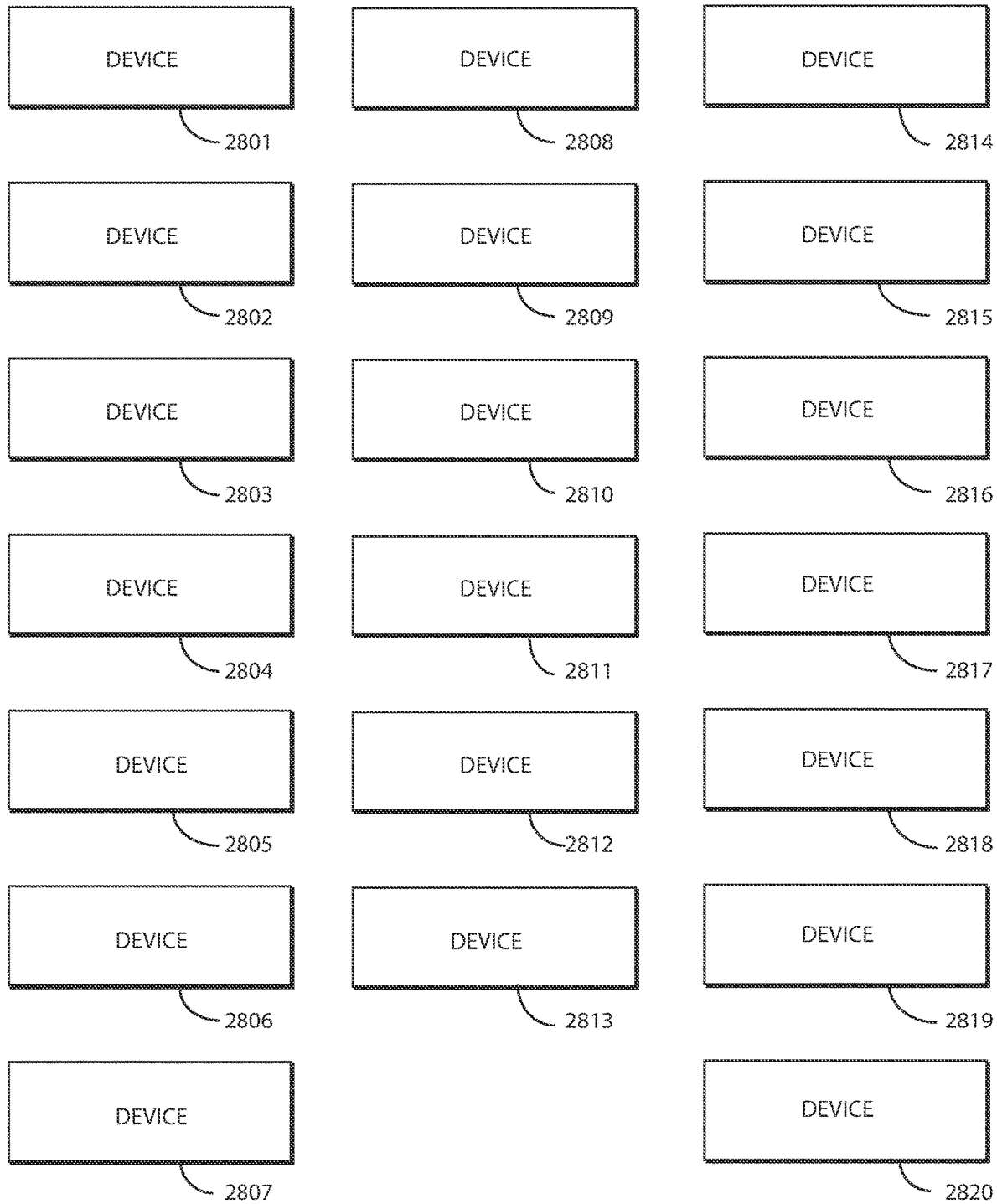
FIG. 28 illustrates various embodiments of the disclosure.

Turning now to FIG. 28, illustrated therein are various embodiments of the disclosure. The embodiments of FIG. 28 are shown as labeled boxes in FIG. 28 due to the fact that the individual components of these embodiments have been illustrated in detail in FIGS. 1-27, which precede FIG. 28.

Accordingly, since these items have previously been illustrated and described, their repeated illustration is no longer essential for a proper understanding of these embodiments. Thus, the embodiments are shown as labeled boxes.

At 2801, an electronic device comprises a first device housing and a second device housing. At 2801, a hinge housing couples the first device housing to the second device housing.

At 2801, the hinge housing comprises a hinge allowing the first device housing to pivot about the hinge housing between an axially displaced open position and a closed position. At 2801, a hinge housing plate is situated within the hinge housing. At 2801, the hinge housing plate translates within the hinge housing between a first position and a second position when the first device housing and the second device housing pivot about the hinge housing from the axially displaced open position to the closed position. At 2802, the second position of 2801 is situated deeper within the hinge housing than the first position.

At 2803, the electronic device of 2802 further comprises a flexible display coupled to the first device housing and the second device housing and spanning the hinge housing. At 2804, the flexible display of 2803 deforms to define a service loop when the first device housing pivots about the hinge housing from the axially displaced open position to the closed position. At 2805, at least a portion of the service loop of 2804 situates within the hinge housing when the first device housing and the second device housing are in the closed position.

At 2806, the hinge housing and hinge housing plate of 2804 define a bridge mechanically supporting the flexible display when the first device housing and the second device housing are in the axially displaced open position.

At 2807, the electronic device of 2802 further comprises a spring mechanism biasing the hinge housing plate toward the second position when the first device housing and the second device housing are in the axially displaced open position. At 2808, the electronic device of 2802 further comprises a first linking arm pivotally coupled to the hinge housing and fixedly coupled to the first device housing and a second linking arm pivotally coupled to the hinge housing and fixedly coupled to the second device housing such that the first device housing and the second device housing are pivotable about the hinge housing.

At 2809, the electronic device of 2808 further comprises interlocking gears coupled between the first linking arm and the second linking arm. At 2809, the interlocking gears cause a symmetric angular rotation of the first device housing and second device housing about the hinge housing, respectively, when the first device housing pivots about the hinge housing relative to the second device housing.

At 2810, the electronic device of 2802 further comprises an actuator coupled between the hinge housing and the hinge housing plate. At 2810, the actuator causes translation of the hinge housing plate within the hinge housing as the first device housing and second device housing pivot between the axially displaced open position and the closed position. At 2811, the actuator of 2810 comprises a V-shaped actuator. At 2812, the actuator of 2810 comprises an X-shaped actuator. At 2813, the actuator of 2810 comprises a pair of oppositely rotating wheels.

At 2814, an electronic device comprises a hinge housing. At 2814, the electronic device comprises a first device housing coupled to the hinge housing and a second device housing coupled to the hinge housing such that the first device housing is pivotable about the hinge housing between an axially displaced open position and a closed position.

At 2814, the electronic device comprises a hinge housing plate situated within the hinge housing. At 2814, the hinge housing plate translates within the hinge housing between a first position and a second position when the first device housing and the second device housing pivot about the hinge housing from the axially displaced open position to the closed position.

At 2815, the electronic device of 2814 further comprises a flexible display coupled to the first device housing and the second device housing and spanning the hinge housing. At 2816, the flexible display of 2815 defines a service loop at least partially situated within the hinge housing when the first device housing and the second device housing are in the closed position.

At 2817, portions of the hinge housing and hinge housing plate of 2815 define a bridge mechanically supporting the flexible display when the first device housing and the second device housing are in the axially displaced open position. At 2818, the electronic device of 2814 further comprises an actuator drawing the hinge housing plate toward the second position when the first device housing and the second device housing pivot from the axially displaced open position to the closed position and elevating the hinge housing plate toward the first position when the first device housing and the second device housing pivot from the closed position to the axially displaced open position.

At 2819, an electronic device comprises a first device housing and a second device housing, each coupled to a hinge housing such that the first device housing is pivotable about the hinge housing relative to the second device housing between an axially displaced open position and a closed position. At 2819, the electronic device comprises a flexible display coupled to the first device housing and the second device housing and spanning the hinge housing. At 2819, a hinge housing plate translates into the hinge housing when the first device housing and the second device housing pivot from the axially displaced open position to the closed position, thereby allowing a service loop defined by the flexible display to at least partially situate within the hinge housing when the first device housing and the second device housing are in the closed position.

At 2820, the electronic device of 2819 further comprises an actuator. At 2820, the actuator ejects the flexible display from an interior of the hinge housing when the first device housing and the second device housing pivot from the closed position to the axially displaced open position.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
   a first device housing and a second device housing;
   a hinge housing coupling the first device housing to the second device housing, the hinge housing comprising a hinge allowing the first device housing to pivot about the hinge housing between an axially displaced open position and a closed position;
   a hinge housing plate situated within the hinge housing and translating within the hinge housing between a first position and a second position when the first device housing and the second device housing pivot about the hinge housing from the axially displaced open position to the closed position;
   a first hinge arm pivotally coupled to the hinge housing and fixedly coupled to the first device housing and a second hinge arm pivotally coupled to the hinge housing and fixedly coupled to the second device housing such that the first device housing and the second device housing are pivotable about the hinge housing; and
   a spring mechanism comprising a first spring and a second spring positioned within openings of the first hinge arm and the second hinge arm, respectively.

2. The electronic device of claim 1, wherein the second position is situated deeper within the hinge housing than the first position.

3. The electronic device of claim 2, further comprising a flexible display coupled to the first device housing and the second device housing and spanning the hinge housing.

4. The electronic device of claim 3, the flexible display deforming to define a service loop when the first device housing pivots about the hinge housing from the axially displaced open position to the closed position.

5. The electronic device of claim 4, wherein at least a portion of the service loop situates within the hinge housing when the first device housing and the second device housing are in the closed position.

6. The electronic device of claim 4, wherein the hinge housing and the hinge housing plate define a bridge mechanically supporting the flexible display when the first device housing and the second device housing are in the axially displaced open position.

7. The electronic device of claim 2, wherein the spring mechanism further comprises a first spring compression strut and second spring compression strut coupled to the first spring and second spring, respectively, with the first spring and second spring biasing the hinge housing plate toward the second position when the first device housing and the second device housing are in the axially displaced open position.

8. The electronic device of claim 7, further comprising:
   a first compression ram and a second compression ram coupled between the first spring compression strut and the first spring and the second spring compression strut and the second spring, respectively; and
   a sealing plate bounding moving components of the hinge, wherein ends of the first spring compression strut and the second spring compression strut situate within pivot apertures of the sealing plate.

9. The electronic device of claim 8, further comprising interlocking gears coupled between the first hinge arm and the second hinge arm, the interlocking gears causing a symmetric angular rotation of the first device housing and second device housing about the hinge housing, respectively, when the first device housing pivots about the hinge housing relative to the second device housing.

10. The electronic device of claim 2, further comprising an actuator coupled between the hinge housing and the hinge housing plate by pins extending from the actuator and situating within a bounded slot coupled to the hinge housing plate, the actuator causing translation of the hinge housing plate within the hinge housing as the first device housing and second device housing pivot between the axially displaced open position and the closed position.

11. The electronic device of claim 10, the actuator comprising a first actuator arm that is adjacent to a second actuator arm at one end, thereby defining a V-shaped actuator, with the pins extending from another end of the first actuator arm and the second actuator arm to situate within the bounded slot.

12. The electronic device of claim 10, the actuator comprising a first actuator arm interfacing a second actuator arm to define an X-shaped actuator with the first actuator arm and the second actuator arm moving in opposite directions with a scissor action to cause a first actuator arm end and a second actuator arm end change position within the hinge housing.

13. The electronic device of claim 10, the actuator comprising a pair of oppositely rotating wheels synchronized with pivoting of the first device housing and second device housing.

14. An electronic device, comprising:
   a hinge housing;
   a first device housing coupled to the hinge housing and a second device housing coupled to the hinge housing such that the first device housing is pivotable about the hinge housing between an axially displaced open position and a closed position;
   a hinge housing plate situated within the hinge housing and translating within the hinge housing between a first position and a second position when the first device housing and the second device housing pivot about the hinge housing from the axially displaced open position to the closed position;
   a bounded slot coupled to the hinge housing plate; and
   an actuator comprising a first actuator arm interfacing a second actuator arm to define an X-shaped actuator with the first actuator arm and the second actuator arm moving in opposite directions with a scissor action to cause a first actuator arm end having a first pin engaging the bounded slot and a second actuator arm end having a second pin engaging the bounded slot to change position within the hinge housing.

15. The electronic device of claim 14, further comprising a flexible display coupled to the first device housing and the second device housing and spanning the hinge housing.

16. The electronic device of claim 15, the flexible display defining a service loop at least partially situated within the hinge housing when the first device housing and the second device housing are in the closed position.

17. The electronic device of claim 15, wherein portions of the hinge housing and the hinge housing plate define a bridge mechanically supporting the flexible display when the first device housing and the second device housing are in the axially displaced open position.

18. The electronic device of claim 14, the actuator drawing the hinge housing plate toward the second position when the first device housing and the second device housing pivot from the axially displaced open position to the closed position and elevating the hinge housing plate toward the first position when the first device housing and the second device housing pivot from the closed position to the axially displaced open position.

19. An electronic device, comprising:
   a first device housing and a second device housing, each coupled to a hinge housing such that the first device housing is pivotable about the hinge housing relative to the second device housing between an axially displaced open position and a closed position;

a flexible display coupled to the first device housing and the second device housing and spanning the hinge housing;

a hinge housing plate translating into the hinge housing when the first device housing and the second device housing pivot from the axially displaced open position to the closed position, thereby allowing a service loop defined by the flexible display to at least partially situate within the hinge housing when the first device housing and the second device housing are in the closed position; and a first hinge arm pivotally coupled to the hinge housing;

a second hinge arm pivotally coupled to the hinge housing;

a first spring biased between the first hinge arm and a compression strut pivotally coupled to the first hinge arm by a sealing plate; and a second spring biased between the second hinge arm and a compression strut pivotally coupled to the second hinge arm by the sealing plate.

20. The electronic device of claim 19, further comprising an actuator ejecting the flexible display from an interior of the hinge housing when the first device housing and the second device housing pivot from the closed position to the axially displaced open position.

\* \* \* \* \*